United States Patent
Okamoto et al.

(10) Patent No.: US 9,519,038 B2
(45) Date of Patent: Dec. 13, 2016

(54) MAGENTIC RESONANCE IMAGING APPARATUS AND RF COIL DEVICE

(71) Applicant: TOSHIBA MEDICAL SYSTEMS CORPORATION, Otawara-Shi, Tochigi-Ken (JP)

(72) Inventors: Kazuya Okamoto, Saitama (JP); Hiromitsu Takamori, Otawara (JP); Yoshinori Hamamura, Moreland Hills, OH (US)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 680 days.

(21) Appl. No.: 13/945,370

(22) Filed: Jul. 18, 2013

(65) Prior Publication Data

US 2014/0021954 A1  Jan. 23, 2014

(30) Foreign Application Priority Data

Jul. 23, 2012  (JP) ................... 2012-162816
Jun. 5, 2013   (JP) ................... 2013-118827

(51) Int. Cl.
    G01R 33/36    (2006.01)
    G01R 33/3415  (2006.01)

(52) U.S. Cl.
    CPC ....... *G01R 33/3692* (2013.01); *G01R 33/3415* (2013.01); *G01R 33/3621* (2013.01)

(58) Field of Classification Search
    CPC .................... G01R 33/36; G01R 33/3607
    See application file for complete search history.

(56) References Cited

U.S. PATENT DOCUMENTS 7,750,635 B2    7/2010  Van Helvoort et al.
2006/0176639 A1  8/2006  Hunter
(Continued)

FOREIGN PATENT DOCUMENTS

CN    1849677 A    10/2006
JP    2010-029644   2/2010

OTHER PUBLICATIONS

Office Action issued Mar. 2015 in CN Patent Application No. 201310310958.6.

*Primary Examiner* — Gregory H Curran
(74) *Attorney, Agent, or Firm* — Nixon & Vanderhye P.C.

(57) ABSTRACT

According to one embodiment, an MRI apparatus (20) obtains a nuclear magnetic resonance signal from an RF coil device (100) which detects the nuclear magnetic resonance signal emitted from an object (P), and this MRI apparatus (20) includes a first radio communication unit (200), a second radio communication unit (300) and an image reconstruction unit (56). The first radio communication unit (200) obtains the nuclear magnetic resonance signal detected by the RF coil device (100), and wirelessly transmits the nuclear magnetic resonance signal in a digitized state via an induced electric field. The second radio communication unit (300) receives the nuclear magnetic resonance signal wirelessly transmitted from the first radio communication unit (200) via the induced electric field. The image reconstruction unit (56) reconstructs image data of the object (P) based on the nuclear magnetic resonance signal received by the second radio communication unit (300).

20 Claims, 11 Drawing Sheets

(56) References Cited

U.S. PATENT DOCUMENTS

| | | | |
|---|---|---|---|
| 2007/0143921 A1* | 6/2007 | Hiyama | A61B 5/0555 5/601 |
| 2008/0311849 A1* | 12/2008 | Washiro | H01P 1/203 455/41.1 |
| 2009/0322335 A1 | 12/2009 | Adachi et al. | |
| 2011/0101977 A1* | 5/2011 | Nakanishi et al. | G01R 33/3692 324/307 |

* cited by examiner

MAGENTIC RESONANCE IMAGING APPARATUS AND RF COIL DEVICE

CROSS-REFERENCE TO RELATED APPLICATIONS

This application is based upon and claims the benefit of priority from Japanese Patent Application No. 2012-162816, filed on Jul. 23, 2012 and Japanese Patent Application No. 2013-118827 filed on Jun. 5, 2013;

The entire contents of which are incorporated herein by reference.

BACKGROUND OF THE INVENTION

1. Field of the Invention

Embodiments described herein relate generally to a magnetic resonance imaging apparatus and an RF coil device.

2. Description of the Related Art

MRI is an imaging method which magnetically excites nuclear spin of an object (a patient) set in a static magnetic field with an RF pulse having the Larmor frequency and reconstructs an image based on MR signals generated due to the excitation. The aforementioned MRI means magnetic resonance imaging, the RF pulse means a radio frequency pulse, and the MR signal means a nuclear magnetic resonance signal.

Here, an RF (Radio Frequency) coil device is a device which transmits an RF pulse to nuclear spin inside an object by, for example, supplying a coil with an RF pulse electric current and detects generated MR signals.

Some of RF coil devices are built-in an MRI apparatus and other RF coil devices are recognized by a control unit of the MRI apparatus by being connected to a connection port of the MRI apparatus such as local RF coil devices, for example.

In MRI, multi-channel structure is promoted in acquisition system of MR signals. The above "channel" means each pathway of a plurality of MR signals outputted from each coil element and inputted to an RF receiver of an MRI apparatus. Although the number of channels is set to equal to or smaller than the input reception number of the RF receiver, a large number of RF coil devices can be connected to an MRI apparatus.

If the number of cables between an RF coil device and an MRI apparatus increases due to promotion of the aforementioned multichannel structure, it is inconvenient because hard-wiring becomes complicated.

Therefore, it is desired to unwire transmission and reception of signals between an RF coil device and an MRI apparatus. However, radio communication by an analogue signal has not been achieved, because there are various restrictions such as degradation of dynamic range.

More specifically, in order to suppress influence on receiving sensitivity to weak MR signals emitted from an object, it is impossible in an MRI apparatus to enlarge the output of electromagnetic waves used for radio communication between an RF coil device and an MRI apparatus.

If it is impossible to enlarge the radio output power, dynamic range degrades due to signal loss caused when transmitted signals travel space. Then, in Japanese Patent Application Laid-open (KOKAI) Publication No. 2010-29664, digital radio communication method in which MR signals are digitized and then transmitted wirelessly is proposed.

Although the problem of restriction of dynamic range can be solved by wirelessly transmitting MR signals after digitalization, this method has the following problems.

Firstly, regulation of radio communication is different from country to country, and the same transmission frequency or the same transmission power can not be necessarily used in other countries.

Secondly, if MR signals are wirelessly transmitted from an RF coil device to an MRI apparatus, the transmitted radiowaves are reflected off surrounding areas and this degrades own data of radio communication.

Therefore, novel technology to wirelessly transmit digitized MR signals from an RF coil device to an MRI apparatus satisfactorily has been desired in MRI.

DETAILED DESCRIPTION

In order to achieve the aforementioned assignment, the inventors of the present invention have worked out a configuration of arranging a first radio communication unit and a second radio communication unit both of which are capable of radio communication via an induced electric field on an RF coil device side and a control side of an MRI apparatus respectively. In this case, the first radio communication unit and the second radio communication unit are fixed to each other within near distance, for example, and digitized MR signals are wirelessly transmitted from the first radio communication unit to the second radio communication unit via an induced electric field.

Hereinafter, examples of aspects which embodiments of the present invention can take will be explained per aspect.

(1) According to one embodiment, an MRI apparatus acquires an MR signal from an RF coil device that detects the MR signal emitted from an object, and this MRI apparatus includes a first radio communication unit, a second radio communication unit and an image reconstruction unit.

The first radio communication unit acquires the MR signal detected by the RF coil device, and wirelessly transmits the digitized MR signal via an induced electric field.

The second radio communication unit receives the MR signal wirelessly transmitted from the first radio communication unit via an induced electric field.

The image reconstruction unit reconstructs image data of the object based on the MR signal received by the second radio communication.

(2) According to one embodiment, an RF coil device includes an detecting unit, an A/D conversion unit and a radio communication unit.

The detecting unit detects an MR signal emitted from an object.

The A/D conversion unit digitizes the MR signal detected by the detecting unit.

The radio communication unit wirelessly transmits the digitized MR signal via an induced electric field.

Examples of embodiments of a magnetic resonance imaging apparatus, an RF coil device and a magnetic resonance imaging method to which the aforementioned configuration is applied will be concretely described with reference to the accompanying drawings as follows.

Note that the same reference numbers are given for identical components in each figure, and overlapping explanation is abbreviated.

Configuration of the Present Embodiment

Figure 1:
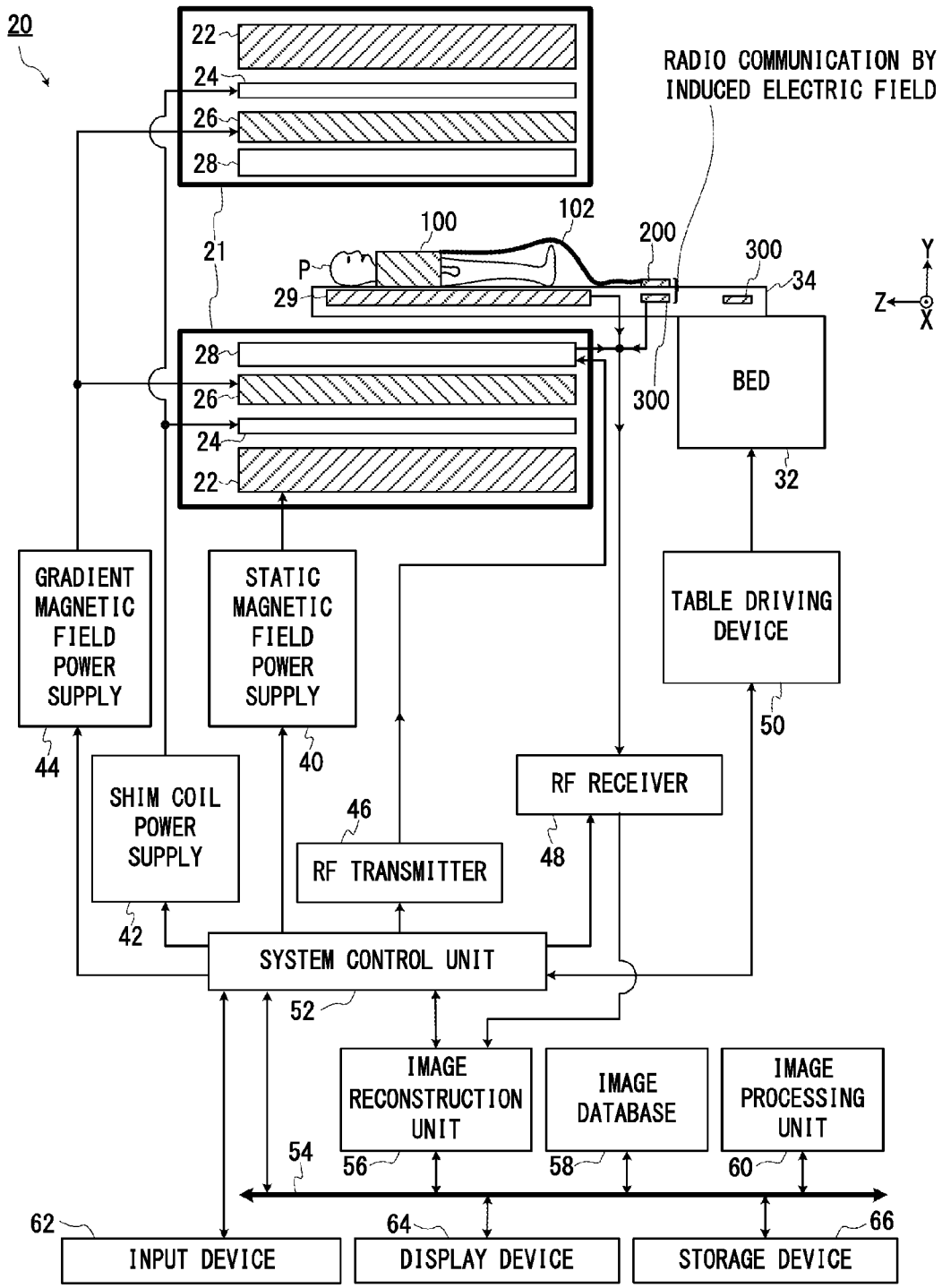
FIG. 1 is a block diagram showing general structure of the MRI apparatus of the present embodiment.

FIG. 1 is a block diagram showing an example of general structure of the MRI apparatus 20 according to the present embodiment.

As shown in FIG. 1, the MRI apparatus 20 includes a gantry 21, a bed 32 and a table 34 on the bed 32.

Additionally, in the gantry 21 which is cylinder-shaped as an example, the MRI apparatus 20 includes a static magnetic field magnet 22, a shim coil 24, a gradient magnetic field coil 26 and a transmission RF coil 28. The gantry 21 corresponds to the parts indicated as thick line frames in FIG. 1.

An object P is set on the table 34. The static magnetic field magnet 22 and the shim coil 24 are, for example, cylinder-shaped. Inside the static magnetic field magnet 22, the shim coil 24 is coaxially arranged with the static magnetic field magnet 22.

Here, as one example, an apparatus coordinate system, whose X axis, Y axis and Z axis are perpendicular to each other, is defined as follows.

Firstly, the direction of an axis of the static magnetic field magnet 22 and the shim coil 24 is aligned with the direction which is perpendicular to the vertical direction, and the direction of the axis of the static magnetic field magnet 22 and the shim coil 24 is defined as the Z axis direction.

Additionally, it is assumed that the vertical direction is the same as the Y axis direction.

Moreover, the table 34 is disposed in such a position that the direction of the normal line of the loading plane thereof on which an object P is put is the same as the Y axis direction.

The MRI apparatus 20 includes, on its control side, a static magnetic field power supply 40, a shim coil power supply 42, a gradient magnetic field power supply 44, an RF transmitter 46, an RF receiver 48, a table driving device 50, a system control unit 52, a system bus 54, an image reconstruction unit 56, an image database 58, an image processing unit 60, an input device 62, a display device 64 and a storage device 66.

The static magnetic field magnet 22 forms a static magnetic field magnet in an imaging space by using electric current supplied from the static magnetic field power supply 40.

The aforementioned "imaging space" means, for example, a space in the gantry 21 in which the object P is placed and to which a static magnetic field is applied.

The static magnetic field magnet 22 includes a superconductivity coil in many cases. The static magnetic field magnet 22 gets electric current from the static magnetic field power supply 40 at excitation. However, once excitation has been made, the static magnetic field magnet 22 is usually isolated from the static magnetic field power supply 40. The static magnetic field magnet 22 may include a permanent magnet which makes the static magnetic field power supply 40 unnecessary.

The shim coil 24 is electrically connected to the shim coil power supply 42 and uniforms the static magnetic field with the electric current supplied from the shim coil power supply 42.

The gradient magnetic field coil 26 is, for example, arranged in the form of a cylinder inside the static magnetic field magnet 22. The gradient magnetic field coil 26 generates a gradient magnetic field Gx in the X axis direction, a gradient magnetic field Gy in the Y axis direction and a gradient magnetic field Gz in the Z axis direction in the imaging region, by using electric current supplied from the gradient magnetic field power supply 44.

That is, directions of a gradient magnetic field Gss in a slice selection direction, a gradient magnetic field Gpe in a phase encoding direction and a gradient magnetic field Gro in a readout (frequency encoding) direction can be arbitrarily set as logical axes, by combining the gradient magnetic fields Gx, Gy and Gz in the three axes of the apparatus coordinate system.

Note that, the above "imaging region" means, for example, a region set as a part of the imaging space and is a range of acquisition of MR signals used to generate one image or one set of images. Here, "one set of images" means, for example, a plurality of images when MR signals of the plurality of images are acquired in a lump in one pulse sequence such as multi-slice imaging. The imaging region is defined three-dimensionally in an apparatus coordinate system, for example.

The RF transmitter 46 generates RF pulses in accordance with control information provided from the system control unit 52, and transmits the generated RF pulses to the transmission RF coil 28.

The transmission RF coil 28 transmits RF pulses given from the RF transmitter 46 to the object P. Note that, the transmission RF coil 28 includes a whole body coil which is built-in the gantry 21 and used for both transmission of RF pulses and detection of MR signals (not shown).

A reception RF coil 29 is disposed inside the table 34. The reception RF coil 29 detects MR signals generated due to excited nuclear spin inside the object P by the RF pulse, and transmits the detected MR signals to the RF receiver 48.

The RF coil device 100 is, for example, a wearable local RF coil device for detecting MR signals. Here, the RF coil device 100 which is set on the chest part and detects MR signals from the chest part is shown, but this is only an example. In the MRI apparatus 20, various wearable RF coil devices such as a shoulder RF coil device and a lumbar part RF coil device can be used for detection of MR signals aside from the RF coil device 100.

As an example here, each of these RF coil devices (100) for detecting MR signals is interpreted as a part of the MRI apparatus 20. However, these RF coil devices may be interpreted as separated components from the MRI apparatus 20. The RF coil device 100 is connected to the coil side radio communication device 200 by the cable 102.

Inside the table 34, a plurality of the control side radio communication devices 300 are arranged. The aforementioned radio communication of digitized MR signals is performed between the coil side radio communication device 200 and one of the control side radio communication devices 300.

Operation of the radio communication will be described later.

Note that, though only two of the control side radio communication devices 300 are shown in FIG. 1 to avoid complication, the number of the control side radio communication devices 300 may be one or more than two.

However, a configuration including many of the separately arranged control side radio communication devices 300 is more preferable than a configuration including only one control side radio communication device 300. This is because the former has more choices to closely fix the coil side radio communication device 200 to the control side radio communication device 300.

In other words, if there are more choices of a fixing position, the coil side radio communication device 200 can be fixed on the nearest control side radio communication device 300 thereto. If it is fixed in such a manner, the cable 102 between the RF coil device 100 and the coil side radio communication device 200 can be shortened.

Note that, the aforementioned "closely fix" means, for example, to fix mutually immovably within a range (distance) of being mutually electromagnetically coupled so as to be capable of radio communication via an induced electric field.

In addition, as an example in the present embodiment, transmission of an RF pulse to the transmission RF coil 28 inside the MRI apparatus 20 and transmission of MR signals detected from the object P are performed under wire transmission except the pathway between the coil side radio communication device 200 and the control side radio communication device 300.

The RF receiver 48 generates complex number data of digitized MR signals (hereinafter, referred to as raw data of MR signals) by performing predetermined signal processing. The RF receiver 48 inputs the generated raw data of MR signals to the image reconstruction unit 56.

The system control unit 52 performs system control of the entirety of the MRI apparatus 20 in imaging operation and image display after imaging operation via interconnection lines such as the system bus 54.

For achieving the above control, the system control unit 52 stores control information needed in order to make the gradient magnetic field power supply 44, the RF transmitter 46 and the RF receiver 48 drive. The aforementioned "control information" includes, for example, sequence information describing operation control information such as intensity, application period and application timing of the pulse electric currents which should be applied to the gradient magnetic field power supply 44.

The system control unit 52 generates the gradient magnetic fields Gx, Gy and Gz and RF pulses by driving the gradient magnetic field power supply 44, the RF transmitter 46 and the RF receiver 48 according to a predetermined sequence stored.

Additionally, the system control unit 52 makes the table 34 move into and out of the imaging space in the gantry 21 in the Z axis direction by controlling the table driving device 50. Additionally, the system control unit 52 can move up and down the table 34 in the Y axis direction by controlling the table driving device 50. The system control unit 52 locates the imaging part of the object P near to the center of the magnetic field in the imaging space by controlling the position of the table 34 in the above manner.

Additionally, the system control unit 52 functions as an imaging condition setting unit. That is, the system control unit 52 sets the imaging conditions of the main scan based on some of the imaging conditions and information inputted to the input device 62 by a user. For achieving this, the system control unit 52 makes the display device 64 display screen information for setting imaging conditions.

The input device 62 provides a user with a function to set imaging conditions and image processing conditions.

The aforementioned term "imaging condition" refers to under what condition an RF pulse or the like is transmitted in what type of pulse sequence, or under what condition MR signals are acquired from the object P, for example.

As a parameter of the imaging conditions, for example, there are the imaging region as positional information in the imaging space, an imaging part, the type of the pulse sequence such as parallel imaging, the type of RF coil devices used for imaging, the number of slices, an interval between respective slices.

The above "imaging part" means a region of the object P to be imaged as an imaging region, such as a head, a chest and an abdomen.

The aforementioned "main scan" is a scan for imaging an intended diagnosis image such as a proton density weighted image, and it does not include a scan for acquiring MR signals for a scout image or a calibration scan. A scan is an operation of acquiring MR signals, and it does not include image reconstruction processing.

The calibration scan is a scan for determining unconfirmed elements of imaging conditions, conditions and data used for image reconstruction processing and so on, and it is performed separately from the main scan. The aftermentioned "prescan" is a calibration scan which is performed before the main scan.

The image reconstruction unit 56 converts the raw data of MR signals inputted from the RF receiver 48 into, for example, matrix data based on a phase encode step number and a frequency encode step number, and stores the converted data as k-space data. The k-space means a frequency space (Fourier space).

The image reconstruction unit 56 generates image data of the object P by performing image reconstruction processing including such as two-dimensional Fourier transformation on the k-space data. The image reconstruction unit 90 stores the generated image data in the image database 58.

The image processing unit 60 takes in the image data from the image database 58, performs predetermined image processing on them, and stores the image data after the image processing in the storage device 66 as display image data.

The storage device 66 stores the display image data after adding accompanying information such as imaging conditions used for generating the display image data and information of the object P (patient information) to the display image data.

The display device 64 displays a screen for setting imaging conditions of the main scan and images indicated by generated image data under control of the system control unit 52.

Figure 2:
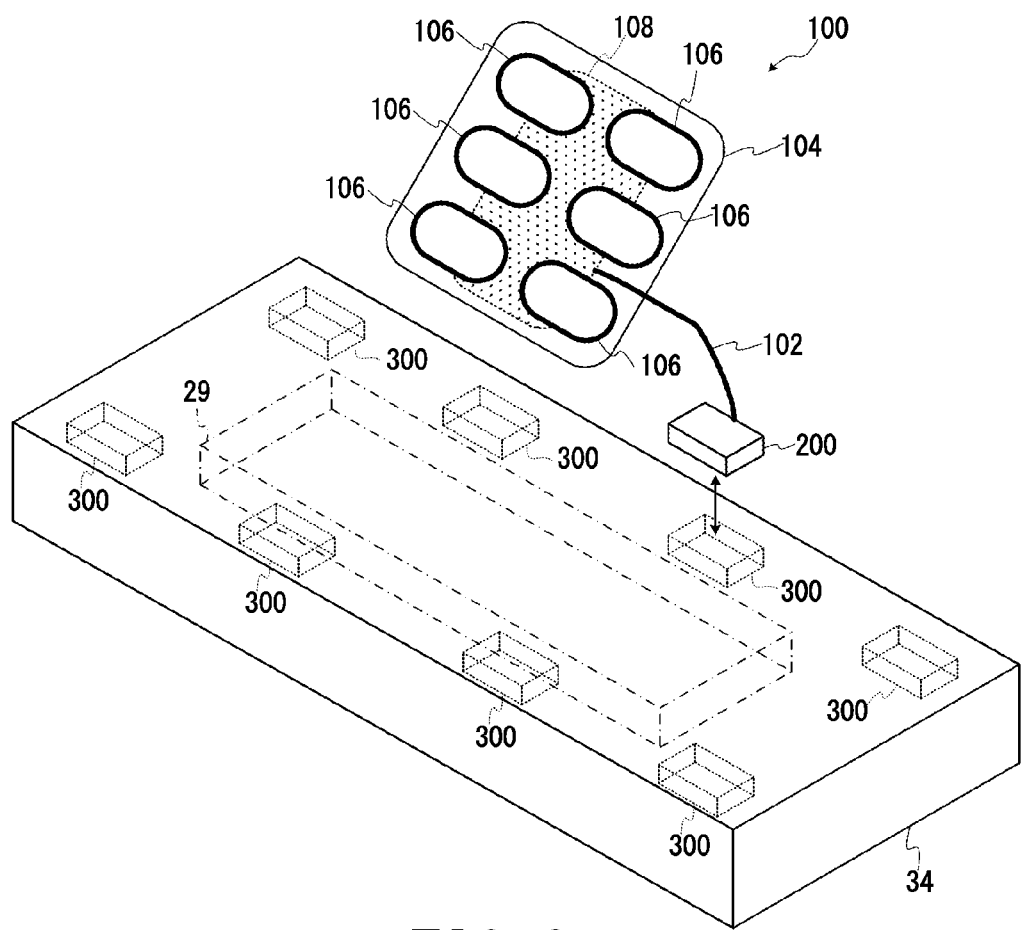
FIG. 2 is a schematic diagram showing an example of structure of an RF coil device and arrangement of a control side radio communication device.

FIG. 2 is a schematic diagram showing an example of structure of the RF coil device 100 and arrangement of the control side radio communication devices 300. As shown in FIG. 2, the RF coil device 100 includes the cable 102 and a cover member 104. The cover member 104 is made of a flexible material and is capable of deformation such as folding. As such a deformable (flexible) material, for example, a flexible circuit board (Flexible Printed Circuit: FPC) described in Japanese Patent Application Laid-open (KOKAI) Publication No. 2007-229004 can be used.

Inside the cover member 104, a plurality of coil elements (surface coils) 106 functioning as antennas which respectively detect MR signals from the object P are disposed. Although six coil elements 106 are shown in FIG. 2 as an example here, the number or shape of the coil elements 106 are not limited to the shown number or shape.

Additionally, inside the cover member 104, the RF coil device 100 includes a control circuit 108 and a memory element (not shown) storing identification information of the RF coil device 100.

As an example here, the RF coil device 100 and the coil side radio communication device 200 are explained as mutually separate components, this is only an example of interpretation. The coil side radio communication device 200 may be configured to be a part of the RF coil device 100. When the coil side radio communication device 200 is a part of the RF coil device 100, the control circuit 108 and the memory element storing the aforementioned identification information may be disposed in the coil side radio communication device 200.

The cable 102 is connected to the coil side radio communication device 200 of the MRI apparatus 20 on its one end. The identification information of the RF coil device 100 is inputted to the system control unit 52 via hard-wiring in the MRI apparatus 20, after the radio transmission between the coil side radio communication device 200 and the control side radio communication device 300.

Additionally, inside the cover member 104 of the RF coil device 100, components such as preamplifiers PMP (see after-mentioned FIG. 4) for amplifying MR signals detected by the coil elements 106 and bandpass filters for filtering may be disposed.

As an example here, eight of the control side radio communication devices 300 are arranged on the side of the loading plane for setting the object P of the table 34.

The object P is, for example, set in the middle of the width direction (the X axis direction in FIG. 1) of the table 34. Thus, in this example, on both end sides in the width direction of the table 34, four of the control side radio communication devices 300 are respectively arranged along the longer direction of the table 34 (the Z axis direction) in a row at intervals.

Note that, the number or arrangement position of the control side radio communication devices 300 is not limited to that of FIG. 2 (inside the table 34). For example, the control side radio communication devices 300 may be disposed and exposed on the table 34 or on the gantry 21. Alternatively, the control side radio communication devices 300 may be disposed inside the gantry 21 or on the bed 32 (see after-mentioned FIG. 7 and FIG. 8).

Figure 3:
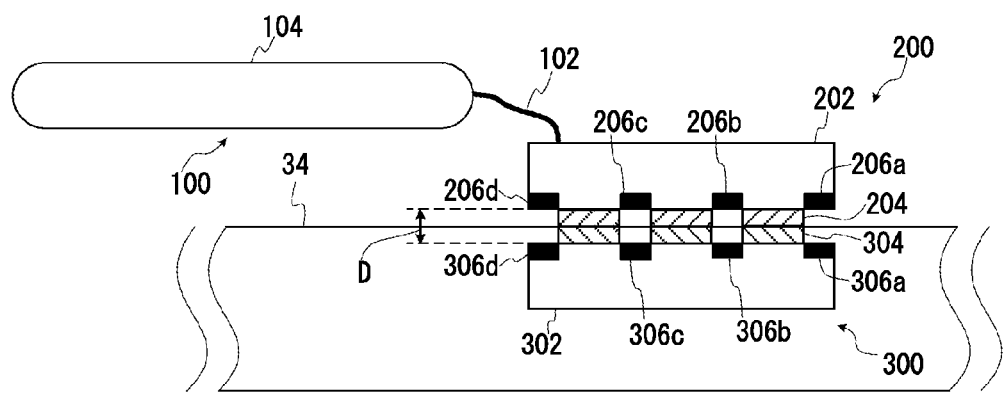
FIG. 3 is a schematic cross-sectional diagram showing an example of a case where the coil side radio communication device and the control side radio communication device are fixed to each other within near distance.

FIG. 3 is a schematic cross-sectional diagram showing an example of a case where the coil side radio communication device 200 and the control side radio communication device 300 are fixed to each other within near distance. As shown in FIG. 3, the coil side radio communication device 200 includes a chassis 202, a fixing member 204 and antennas 206*a*, 206*b*, 206*c* and 206*d*.

A control circuit (not shown) inside the chassis 202 is connected to the RF coil device 100 via the cable 102. Although other components such as A/D (analog to digital) converters are included in the chassis 202, their details are described later with FIG. 4.

Inside the chassis 202, the antennas 206*a* to 206*d* are disposed on the side of its rear surface (the downside surface in FIG. 3). Although the fixing member 204 is the three shaded rectangular regions in FIG. 3, it is not necessary to be divided into three regions. For example, the fixing member 204 may be composed in an integrated fashion. The fixing member 204 is fixed on the rear surface of the chassis 202. The fixing member 204 is, for example, a male side of a hook-and-loop fastener such as magic tape (Trademark) and VELCRO (Trademark).

The control side radio communication device 300 includes a chassis 302, a fixing member 304 and antennas 306*a*, 306*b*, 306*c* and 306*d*. Although other components such as a reference signal transmitting unit are included inside the chassis 302, their details will be described later with FIG. 4. Inside the chassis 302, the antennas 306*a* to 306*d* are disposed on the side of the top surface.

Each of the antennas 306*a* to 306*d* corresponds to each of the above antennas 206*a* to 206*d* so as to group into a pair (totally, four pairs). Out of the antennas 206*a* to 206*d* and 306*a* to 306*d*, at least the pathway between the antennas 206*a* and 306*a* is composed of, for example, later-described induced electric field combined couplers.

The fixing member 304 is, for example, the female side of the aforementioned hook-and-loop fastener. Although the fixing member 304 is the three shaded rectangular regions in FIG. 3, it is not necessary to be divided into three regions. The fixing member 204 may be composed in an integrated fashion, and it is the same as the fixing member 204. The fixing member 304 is fixed on the top surface of the chassis 302. In this example, the control side radio communication device 300 is arranged in such a manner that the fixing member 304 is in parallel with the anterior surface of the table 34 and the fixing member 304 is exposed on the anterior surface of the table 34.

However, the above configuration of exposing solely the fixing member 304 is only an example. For example, almost the entirety of the control side radio communication device 300 may be exposed on the table 34, without solely exposing the fixing member 304. That is, the surface of the control side radio communication device 300 facing opposite to the fixing member 304 may be fixed to the loading surface (top surface) of the table 34.

The coil side radio communication device 200 is detachably fixed to the control side radio communication device 300 with the fixing members 204 and 304. Note that, in this example, the control side radio communication device 300 is fixed to inside of the table 34 and is immovable. Additionally, the male and female side of the fixing members 204 and 304 may be exchanged with each other.

Additionally, the antennas 206a to 206d are disposed so as to face the antennas 306a to 306d respectively, when the coil side radio communication device 200 and the control side radio communication device 300 are fixed so as to face each other by the fixing members 204 and 304.

Here, a plurality of the control side radio communication devices 300 are discretely arranged on the table 34. Thus, no matter which part of the object P the RF coil device 100 is set on, the coil side radio communication device 200 can be closely fixed to the nearest control side radio communication device 300, and thus the length of the cable 102 can be shortened.

The radio communication via an induced electric field is performed on the pathway between the coil side radio communication device 200 and the control side radio communication device 300. An induced electric field means an electric field caused by time change of magnetic flux density. As short-distance radio communication via an induced electric field, for example, TransferJet (Trademark) which uses an induced electric field combined coupler as an antenna can be used (see Japanese Patent Application Laid-open (KOKAI) Publication No. 2010-147922, for example).

More specifically, the induced electric field combined coupler includes a coupling electrode, a resonance stub, a ground and so on (not shown). If an electric signal is inputted to the resonance stub of the transmission side, electric charges are accumulated in the coupling electrode, and virtual electric charges equal to the electric charges accumulated in the coupling electrode are generated in the ground. Thereby, a micro electrical dipole is composed by these electric charges, and this micro electrical dipole functions as a transmission side antenna. That is, data are transmitted to the receiving side via an induced electric field of a longitudinal wave generated by the micro electrical dipole. Because a longitudinal wave vibrating in parallel with the traveling direction is not influenced by the direction of an antenna, stable data transmission can be achieved.

However, if the receiving side is separated from the transmission side beyond limit, both sides are not electro-magnetically coupled and data transmission cannot be performed. This is because induced electric fields formed by the induced electric field combined couplers rapidly attenuate if the interval between both sides of the couplers become distant.

Although the antennas 206a to 206d are discretely disposed and the antennas 306a to 306d are discretely disposed in order to distinguish respective components in FIG. 3, interference between each of the four radio communication pathway can be avoided without arranging them separately. That is, the four radio frequencies respectively used in the pathway of the antennas 206a to 306, the pathway of the antennas 206b to 306b, the pathway of the antennas 206c to 306c and the pathway of the antennas 206d to 306d may be separated (their frequency values may be widely set apart). As to the radio communication frequency, it is preferable to avoid frequencies which are equal to numbers obtained by dividing a center frequency of RF pulses transmitted to the object P by a natural number, in each of the radio communication pathway.

It is preferable that installation positions of the control side radio communication devices 300 are not too deep from the surface of the table 34. If positions of the antennas 306a to 306d of each of the control side radio communication devices 300 in the table 34 are too deep, the interval D (see FIG. 3) between the transmission side and the receiving side can not be close enough to electro-magnetically couple the antennas 206a to 206d of the transmission side to the antennas 306a to 306d of the receiving side. In this case, the radio communication via an induced electric field will be difficult to be achieved.

That is, it is preferable to dispose each of the control side radio communication devices 300 to such a position that each control side radio communication device 300 can be fixed to the coil side radio communication device 200 close enough to be electro-magnetically coupled to the coil side radio communication device 200.

Because short-distance radio communication via an induced electric field is performed, the fixing member 304 does not need to be connected to the chassis 302 of the control side radio communication device 300.

Thus, if the chassis 302 of the control side radio communication device 300 is not exposed on the surface of the table 34 (if it is disposed inside the table 34), for example, the fixing member 304 may be disposed to such a position located in upside of the control side radio communication device 300 in the vertical direction on the surface of the table 34.

Thereby, installation position of each of the control side radio communication devices 300 inside the table 34 can be judged (estimated), and the coil side radio communication device 200 can be fixed to the position nearest to the control side radio communication device 300.

Note that, as long as an electric dipole (antenna) of the coil side radio communication device 200 side is not directly contacted to an electric dipole (antenna) of the control side radio communication device 300 side, the chassis covering the antennas of the coil side radio communication device 200 side may be contacted to the chassis covering the antennas of the control side radio communication device 300 side. This is because it is enough if the interval D causing an induced electric field is kept between the antennas of the transmission side and the antennas of the receiving side.

Additionally, if imaging time is long, for example, 10 minutes, 20 minutes and 30 minutes, transmission span of MR signals becomes long. During the transmission span, it is preferable to fix the transmission side and the receiving side each other so as not to jolt out of alignment. Thus, configuration of including a component fixing the transmission side and the receiving side so as not to move each other is preferable like the present embodiment.

By equipping a fixing method, the MRI apparatus becomes free from the possibility that the RF coil device 100 set on the object P is moved by movement of the object P during imaging and this moves the radio communication devices, resulting in communication error of the MR signals detected from the object P.

Note that, as to a method of fixing the coil side radio communication device 200 and the control side radio communication device 300, it is not limited to the aforementioned hook-and-loop fastener and other fixing methods may be used alternatively. For example, the coil side radio communication device 200α may be inserted (interdigitated) to a fixing structure like the after-mentioned FIG. 9.

Figure 4:
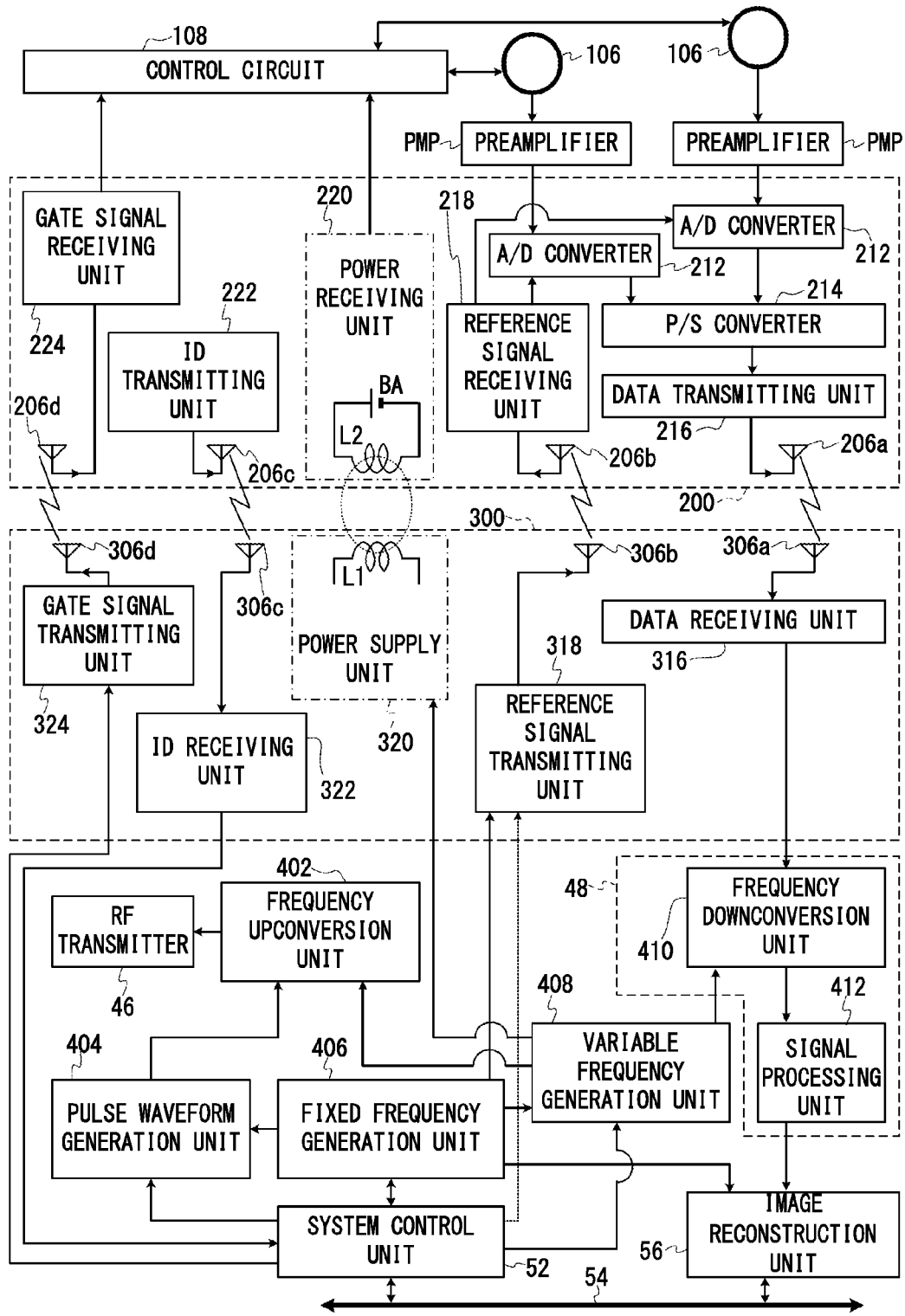
FIG. 4 is a schematic block diagram showing the functions of the respective units relevant to transmission of MR signals detected by coil elements of the RF coil device.

FIG. 4 is a schematic block diagram showing the functions of the respective units relevant to transmission of the MR signals detected by the coil elements 106 of the RF coil device 100.

As shown in FIG. 4, the coil side radio communication device 200 further includes a plurality of A/D converters 212, a P/S (Parallel/Serial) converter 214, a data transmitting unit 216, a reference signal receiving unit 218, a power receiving unit 220, an ID (Identification Information) transmitting unit 222 and a gate signal receiving unit 224.

Additionally, the power receiving unit 220 includes a rechargeable battery BA and a coil L2.

The control side radio communication device 300 further includes a data receiving unit 316, a reference signal transmitting unit 318, a power supply unit 320, an ID (Identification Information) receiving unit 322 and a gate signal transmitting unit 324. Additionally, the power supply unit 320 includes a coil L1.

Additionally, the control system of the MRI apparatus 20 further includes a frequency upconversion unit 402, a pulse waveform generation unit 404, a fixed frequency generation unit 406, a variable frequency generation unit 408, aside from the components shown in FIG. 1. Additionally, the RF receiver 48 includes a frequency downconversion unit 410 and a signal processing unit 412.

As an example in the present embodiment, there are a region where an induced magnetic field for charging is generated and four radio communication pathways between the coil side radio communication device 200 and the control side radio communication device 300. In the following, the above region and pathways will be explained in order.

Consider a case where the coil L2 of the power receiving unit 220 is located in a position close enough to be electromagnetically coupled to the coil L1 of the power supply unit 320 (i.e. a case where the coil side radio communication device 200 is closely fixed to the control side radio communication device 300). In this case, the power supply unit 320 supplies a primary current to the coil L1 so as to generate an induced magnetic field, thereby electromotive force is caused in the coil L2. By this electromotive force, a secondary current flows the coil L2 and thereby the rechargeable battery BA is charged.

The power receiving unit 220 provides the electric power charged in the above manner to each component of the coil side radio communication device 200 via hard-wiring (not shown). Additionally, the power receiving unit 220 provides the above electric power to each component such as the control circuit 108 of the RF coil device 100 via the cable 102. Here, as to the frequency of the primary current supplied to the coil L1, it is preferable to separate the frequency from each communication frequency used in the four radio communication pathways. This is so that signals in the four radio communication pathways between the antennas 206a to 206d and the antennas 306a to 306d are not interfered by the above primary current.

As a method of saving electric power of the RF coil device 100, instead of the power receiving unit 220 and the power supply unit 320, a rechargeable battery may be embedded in the RF coil device 100 and this rechargeable battery may be charged during unused span of the RF coil device 100. Alternatively, a rechargeable battery charged during unused span of the RF coil device 100 and the above power receiving unit 220 and the power supply unit 320 may be used in combination.

Next, the four radio communication pathways will be explained. Although the radio communication via an induced electric field is performed at least in the pathway between the antennas 206a and 306a, it may be performed in the pathway between the antennas 206b and 306b, or the pathway between the antennas 206d and 306d.

Firstly, in the pathway between the antennas 206c and 306c, the identification information of the RF coil device 100 is transmitted from the coil side radio communication device 200 to the control side radio communication device 300.

More specifically, for example, the above identification information is preliminarily stored in the ID transmitting unit 222. If the ID receiving unit 322 gets close to the ID transmitting unit 222, the identification information stored in the ID transmitting unit 22 is automatically transmitted from the antenna 206c to the antenna 306c as a digital signal. This radio communication of the identification information may be performed in the same way as RFID (Radio Frequency Identification) typified by, for example, IC (Integrated Circuit) tag.

The ID receiving unit 322 inputs the identification information of the RF coil device 100 received by the antenna 306c to the system control unit 52. Thereby, the system control unit 52 recognizes information on which of various types of RF coil devices such as the chest part RF coil device and the shoulder RF coil device is(are) currently connected.

Secondly, in the pathway between the antennas 306d and 206d, a gate signal is continuously wirelessly transmitted from the gate signal transmitting unit 324 of the control side radio communication device 300 to the gate signal receiving unit 224 of the coil side radio communication device 200 during imaging.

More specifically, as a switch changing on-off state of each coil element 106 of the RF coil device 100, for example, a trap circuit including a PIN diode (p-intrinsic-n Diode) and so on are used. The gate signal is a control signal of the above switch.

Note that, as an alternative configuration, a trigger signal may be transmitted from the gate signal transmitting unit 324 to the gate signal receiving unit 224 and the gate signal is generated inside the gate signal receiving unit 224 based on the trigger signal.

While RF pulses are transmitted to the object P, the gate signal inputted to the RF coil device 100 via the gate signal transmitting unit 324, the antenna 306d, the antenna 206d and the gate signal receiving unit 224 is generally set to on level. During the on level span of the gate signal, the above switch becomes off state so as to disconnect the loop of each of the coil elements 106 and thereby each of the coil elements 106 can not detect MR signals.

Except the span during which RF pulses are transmitted to the object P, the gate signal adjusted to off-level is wirelessly transmitted. While the gate signal is off-level, the above switch becomes on-state and each of the coil elements 106 can detect MR signals. Coupling effect between the transmission RF coil 28 which transmits MR signals to the object P and the coil elements 106 which respectively detect MR signals from the object P is prevented by the above on/off switching of the coil elements 106.

Thirdly, in the pathway between the antennas 306b and 206b, a digital reference signal is continuously wirelessly transmitted from the reference signal transmitting unit 318 of the control side radio communication device 300 to the reference signal receiving unit 218 of the coil side radio communication device 200 during imaging.

More specifically, the reference signal is a signal that synchronizes the coil side radio communication device 200 as a transmission side of MR signals with a basic frequency of system based on the fixed frequency generation unit 406. The reference signal transmitting unit 318 generates the reference signal by performing processing such as modulation, frequency conversion, amplification and filtering on the criteria clock signal inputted from the fixed frequency generation unit 406.

The fixed frequency generation unit 406 generates the criteria clock signal whose frequency is constant. The fixed frequency generation unit 406 includes a crystal controlled oscillator with high degree of stability and so on, in order to generate the criteria clock signal.

The fixed frequency generation unit 406 inputs the criteria clock signal to the reference signal transmitting unit 318 and the variable frequency generation unit 408. Additionally, the fixed frequency generation unit 406 inputs the criteria clock signal to respective components performing clock synchronization inside the MRI apparatus 20 such as the image reconstruction unit 56 and the pulse waveform generation unit 404.

The variable frequency generation unit 408 includes PLL (Phase-Locked Loop), DDS (Direct Digital Synthesizer), and a mixer. The variable frequency generation unit 408 operates based on the above criteria clock signal. The variable frequency generation unit 408 generates a local signal (clock signal) of variable frequency that accords with a setting value inputted from the system control unit 52 as a center frequency of RF pulses.

In order to achieve this, the system control unit 52 inputs a default value of the center frequency of the RF pulses to the variable frequency generation unit 408 before a prescan. Additionally, the system control unit 52 inputs a corrected value of the center frequency of the RF pulses to the variable frequency generation unit 408 after the prescan.

The variable frequency generation unit 408 inputs the above local signal of variable frequency to the frequency downconversion unit 410 and the frequency upconversion unit 402.

Additionally, a trigger signal (A/D conversion start signal) that determines timing of sampling in the A/D converters 212 of the coil side radio communication device 20 is inputted from the system control unit 52 to the reference signal transmitting unit 318. The above sampling means, for example, to extract intensity of an analog signal at regular time intervals so as to enable digital record. As an example here, the reference signal transmitting unit 318 wirelessly transmits both the reference signal and the trigger signal to the reference signal receiving unit 218 by superimposing trigger signal on the reference signal.

Fourthly, in the pathway between the antennas 206a and 306a, digitized MR signals are wirelessly transmitted from the data transmitting unit 216 of the coil side radio communication device 200 to the data receiving unit 316 of the control side radio communication device 300 via an induced electric field.

More specifically, inside the RF coil device 100, a plurality of preamplifiers PMP respectively corresponding to the coil elements 106 are disposed in front of the A/D converters 212. MR signals detected by the respective coil elements 106 of the RF coil device 100 are amplified by each of the preamplifiers PMP, then inputted to the respective A/D converters 212 of the coil side radio communication device 200 as analog signals, and then converted into digital signals. At this time, the reference signal and trigger signal are inputted to each of the A/D converters 212 from the reference signal receiving unit 218. Thus, each of the A/D converters 212 starts sampling and quantization based on the reference signal (sampling clock signal) in synchronization with the timing when the trigger signal is transmitted.

Each of the A/D converters 212 inputs digitized MR signals to the P/S converter 214. MR signals detected by a plurality of the coil elements 106 and undergone A/D conversion respectively are plural. Therefore, the P/S converter 214 converts these plural MR signals from parallel signals into a serial signal for radio transmission, and inputs the serial signal to the data transmitting unit 216. This is because the number of antenna for transmitting MR signals is only one (the antenna 206a) in the example of the present embodiment.

However, the present embodiment is not limited to the aspect of transmitting MR signals as a serial signal. For example, MR signals may be wirelessly transmitted as parallel signals by increasing the number of antennas for transmitting and receiving MR signals.

The data transmitting unit 216 generates MR signals for radio transmission (which are serial signals and digital signals) by performing processing such as error correction encoding, interleave, modulation, frequency conversion, amplification, and filtering on the inputted serial MR signals. The data transmitting unit 216 wirelessly transmits the MR signals for radio transmission from the antenna 206a to the antenna 306a.

The data receiving unit 316 performs processing such as amplification, frequency conversion, demodulation, deinterleave and error correction decoding on the serial MR signals received by the antenna 306a. Thereby, the data receiving unit 316 extracts the original digitized MR signals from the MR signals for radio transmission, and inputs the extracted MR signals to the frequency downconversion unit 410 of the RF receiver 48.

The frequency downconversion unit 410 multiplies the MR signals inputted from the data receiving unit 316 by the local signal inputted from the variable frequency generation unit 408, and makes an arbitrary signal band get through by filtering. Thereby, the frequency downconversion unit 410 performs frequency conversion (downconversion) on the MR signals, and inputs the MR signals whose frequency is lowered to the signal processing unit 412.

The signal processing unit 412 generates raw data of the MR signals by performing predetermined signal processing on the above MR signals whose frequency is lowered. The raw data of the MR signals are inputted to the image reconstruction unit 56, and converted into k-space data and stored in the image reconstruction unit 56 as described earlier.

Note that, though the RF receiver 48 and the control side radio communication device 300 are explained as mutually separate components in the above configuration, this is only an example. For example, the RF receiver 48 may be a part of the control side radio communication device 300.

Additionally, as to the gate signal, it may be superimposed on the reference signal in the way similar to the trigger signal. In this case, because the number of radio communication pathways can be decreased by one by omitting components such as the antennas 206d and 306d, configuration of the coil side radio communication device 200 and the control side radio communication device 300 can be streamlined.

The foregoing is an explanation of the four radio communication pathways.

In FIG. 4, the system control unit 52 determines the imaging conditions such as a repetition time (RF pulse cycle), a type of RF pulses, the center frequency of the RF pulses and a band width of the RF pulses in a pulse sequence, based on the imaging conditions inputted by a user via the input device 62. The system control unit 52 inputs the imaging conditions determined in the above manner to the pulse waveform generation unit 404.

The pulse waveform generation unit 404 generates a pulse waveform signal of baseband by using the criteria clock signal inputted from the fixed frequency generation unit 406, depending on the imaging conditions inputted from the system control unit 52 in the above manner. The pulse waveform generation unit 404 inputs the pulse waveform signal of baseband to the frequency upconversion unit 402.

The frequency upconversion unit 402 multiplies the pulse waveform signal of baseband by the local signal inputted from the variable frequency generation unit 408, then makes an arbitrary signal band pass by filtering, and thereby performs frequency conversion (upconversion). The frequency upconversion unit 402 inputs the pulse waveform signal of baseband whose frequency is raised to the RF transmitter 46. The RF transmitter 46 generates the RF pulses based on the inputted pulse waveform signal.

Operation of the Present Embodiment

Figure 5:
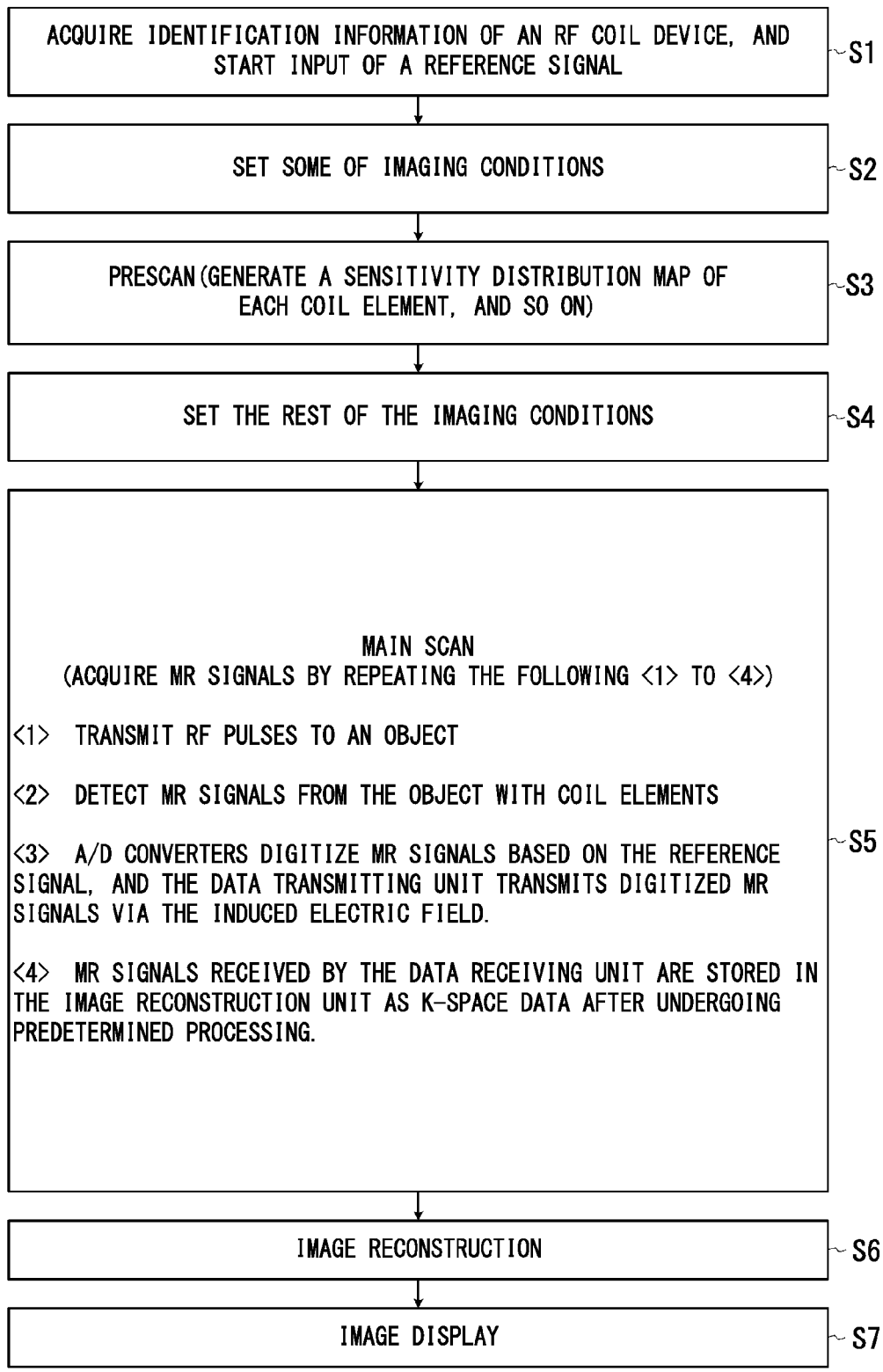
FIG. 5 is a flowchart illustrating an example of flow of imaging operation performed by the MRI apparatus of the present embodiment.

FIG. 5 is a flowchart illustrating an example of flow of imaging operation performed by the MRI apparatus 20 of the present embodiment. In the following, according to the step numbers in the flowchart shown in FIG. 5, an operation of the MRI apparatus 20 will be described by referring to the aforementioned FIG. 1 to FIG. 4 as required.

Note that, although a case of using the above RF coil device 100 will be explained as an example here, the same effects as the present embodiment can be obtained by disposing components similar to the coil side radio communication device 200 in other cases where other RF coil devices such as a shoulder RF coil device and a head RF coil device are used.

[Step S1] The RF coil device 100 is set on the object P on the table 34, and its coil side radio communication device 200 is detachably fixed to the nearest control side radio communication device 300. That is, the coil side radio communication device 200 is detachably and closely fixed to one of the control side radio communication devices 300 on the table 34, for example (see FIG. 2 and FIG. 3).

By the above short-distance fixation, the coil side radio communication device 200 falls within the range capable of communicating with the control side radio communication device 300. If the coil side radio communication device 200 and the control side radio communication device 300 fall within the range capable of mutual communication, the aforementioned electric power supply and communication are started between both sides.

More specifically, the ID transmitting unit 222 wirelessly transmits the identification information of the RF coil device 100 to the ID receiving unit 322, by operating with the use of electric power wirelessly supplied from the ID receiving unit 322.

The system control unit 52 acquires this identification information, and recognizes that the RF coil device 100 is currently connected. Thereby, the system control unit 52 gives (outputs) a permission of further communication between the coil side radio communication device 200 and the control side radio communication device 300, and makes the power supply unit 320 supply electric power to the power receiving unit 220.

Therefore, the power supply unit 320 and the power receiving unit 220 start electric power supply to each component of the coil side radio communication device 200 and each component of the RF coil device 100 such as the control circuit 108, via an induced magnetic field as described earlier.

Additionally, the reference signal transmitting unit 318 start inputting the digital reference signal to the reference signal receiving unit 218 through the radio communication pathway between the antennas 306b and 206b via, for example, an induced electric field, according to the communication permission outputted by the system control unit 52 (the reference signal is continuously wirelessly transmitted). Note that, the trigger signal for determining sampling timing is superimposed (added) on the transmitted reference signal.

Additionally, the table driving device 50 (see FIG. 1) moves the table 34 to inside the gantry 21 according to the control by the system control unit 52. After this, the process proceeds to Step S2.

[Step S2] The system control unit 52 sets some of the imaging conditions of the main scan based on the imaging conditions inputted to the MRI apparatus 20 via the input device 62 and information on which currently used RF coil device acquired in Step S1 (in this example, information indicating that the RF coil device 100 is used). After this, the process proceeds to Step S3.

[Step S3] The system control unit 52 makes the MRI apparatus 20 perform prescans by controlling each part of the MRI apparatus 20. In the prescans, for example, a corrected value of the center frequency of the RF pulses is calculated, and a sensitivity distribution map of each of the coil elements 106 of the RF coil device 100 is generated. After this, the process proceeds to Step S4.

[Step S4] The system control unit 52 sets the rest of the imaging conditions based on the execution results of the prescans. After this, the process proceeds to Step S5.

[Step S5] The system control unit 52 makes the MRI apparatus 20 perform the main scan by controlling each component thereof.

More specifically, a static magnetic field is formed in the imaging space by the static magnetic field magnet 22 excited by the static magnetic field power supply 40. In addition, electric current is supplied from the shim coil power supply 42 to the shim coil 24, and thereby the static magnetic field formed in the imaging space is uniformed.

Note that, during the implementation term of the main scan, the aforementioned gate signal is continuously transmitted between the antennas 306d and 206d from the gate signal transmitting unit 324 to the gate signal receiving unit 224.

After this, when the system control unit 52 receives a command of start of imaging from the input device 62, the MR signals from the object P are acquired (collected) by repeating the following processes of <1> to <4> in series.

<1> The system control unit 52 drives the gradient magnetic field power supply 44, the RF transmitter 46 and the RF receiver 48 according to the pulse sequence, thereby gradient magnetic fields are formed in the imaging region including the imaging part of the object P, and the RF pulses are transmitted from the transmission RF coil 28 to the object P. Only during the transmission period of the RF pulses, the gate signal is set to, for example, on-level, and this sets each of the coil elements 106 of the RF coil device 100 to off-state so as to prevent the aforementioned coupling.

<2> The gate signal is switched over to, for example, off level after transmission of the RF pulses, and each of the coil elements 106 detects the MR signals caused by nuclear magnetic resonance inside the object P. The detected analog MR signals are inputted from each of the coil elements 106 to each of the preamplifiers PMP, amplified by each of the preamplifiers PMP, and then inputted to each of the A/D converters 212, respectively (see FIG. 4).

<3> Each of the A/D converters 212 starts sampling and quantization of the MR signals in synchronization with the timing when the trigger signal is wirelessly transmitted. Each of the A/D converters 212 inputs digitized MR signals to the P/S converter 214, respectively. The P/S converter 214 converts the inputted plural MR signals into a serial signal, and inputs the serial signal to the data transmitting unit 216. The data transmitting unit 216 generates MR signals for radio transmission by performing predetermined processing on the serial MR signals, and wirelessly transmits the serial MR signals from the antenna 206a to the antenna 306a via induced electric fields.

<4> The data receiving unit 316 extracts the original digital MR signals by performing predetermined processing on the MR signals for radio transmission received by the antenna 306a, and inputs the extracted MR signals to the frequency downconversion unit 410. The frequency downconversion unit 410 performs frequency downconversion on the inputted MR signals, and inputs the MR signals whose frequency is lowered to the signal processing unit 412. The signal processing unit 412 generates raw data of the MR signals by performing predetermined processing on the inputted MR signals. The raw data of MR signals are inputted to the image reconstruction unit 56, and converted into k-space data and stored in the image reconstruction unit 56.

After completion of acquisition of MR signals by repeating the above <1> to <4> processes, the process proceeds to Step S6.

[Step S6] The image reconstruction unit 56 reconstructs image data by performing image reconstruction processing including Fourier transformation on the k-space data. The image reconstruction unit 56 stores the reconstructed image data in the image database 58 (see FIG. 1). After this, the process proceeds to Step S7.

[Step S7] The image processing unit 60 obtains the image data from the image database 58 and generates display image data by performing predetermined image processing on the obtained image data. The image processing unit 96 stores the display image data in the storage device 66. Then, the system control unit 52 transmits the display image data to the display device 64, and makes the display device 64 display images indicated by the display image data.

After completion of imaging, the coil side radio communication device 200 is detached from the control side radio communication device 300. When both of them are moved beyond the range capable of radio communication, radio communication and electric power supply between both sides are concluded.

Note that, as an example in FIG. 5, the input of the reference signal starts in Step S1. However, this is only an example. For example, the input of the reference signal may start just before the prescans in Step S3 (i.e. after setting the imaging conditions in Step S2).

The foregoing is a description of the operation of the MRI apparatus 20 according to the present embodiment.

Effects of the Present Embodiment

As just described in the present embodiment, the transmission side and the receiving side are closely fixed to each other in time of radio communication, and the radio communication via an induced electric field is performed. Therefore, because output power of radio communication can be more lowered than digital radio communication of conventional technology, the MRI apparatus 20 of the present embodiment easily accommodates to legal regulations in various countries.

In addition to the mutually closely-situated transmission side and receiving side, output power of radio communication can be lowered. Therefore, the problem that the transmitted radio waves are reflected off surrounding areas and this degrades own data of radio communication does not occur. Thus, digitized MR signals can be wirelessly transmitted satisfactorily from the RF coil device 100 side to the control side of the MRI apparatus 20 (the RF receiver 48 side).

Additionally, a plurality of the MR signals respectively detected by the plurality of the coil elements 106 are converted into a serial signal and then wirelessly transmitted. Thus, the necessary number of an antenna for transmitting the MR signals (radio communication pathway) is only one pair, and frequency separation for preventing interference is not necessary between each of the MR signals.

On the other hand, in the digital radio communication of conventional technology, the receiving side is located far from the transmission side. Thus, in the digital radio communication of conventional technology, frequency separation and time-multiplexed communication are performed, because interference such as crosstalk occurs if a plurality of coil elements for receiving MR signals are simultaneously connected. In a short-distance radio communication like the present embodiment, it is not necessary to perform time-multiplexed communication.

Additionally, the control side radio communication devices 300 are respectively disposed to mutually separated positions, and it is enough to fix the coil side radio communication device 200 to any one of the control side radio communication devices 300. Thus, no matter which part of the object P an RF coil device is set on (i.e. no matter where the RF coil device 100 is located on the table 34), the coil side radio communication device 200 and the control side radio communication device 300 can be closely fixed to each other and MR signals can be wirelessly transmitted satisfactorily.

Additionally, because the electric power supply to the RF coil device 100, the transmission of the gate signal and the transmission of the trigger signal are wirelessly performed, configuration of the MRI apparatus 20 can be simplified. As a result, cost of manufacturing the MRI apparatus 20 can be reduced.

According to the aforementioned embodiment, digitized MR signals can be wirelessly transmitted from an RF coil device to an MRI apparatus satisfactorily, in MRI.

Supplementary Notes of the Present Embodiment

Hereinafter, modified embodiments and supplementary notes on the aforementioned embodiment will be explained.

[1] Although the RF coil device 100 and the coil side radio communication device 200 are explained as mutually separate components in the aforementioned embodiment, as described earlier, the coil side radio communication device 200 may be a part of the RF coil device 100. Such case will be explained as the first modified embodiment as follows.

Figure 6:
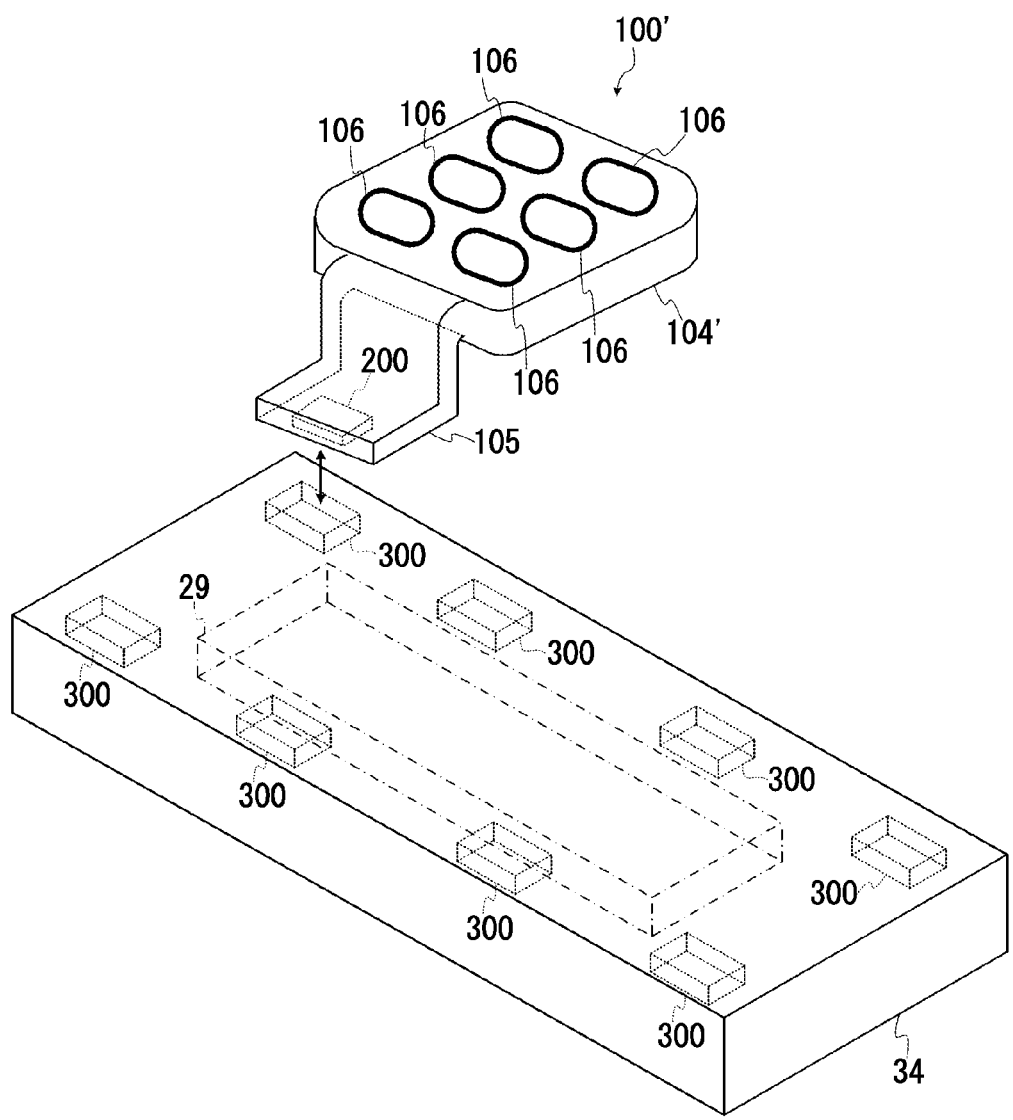
FIG. 6 is a schematic oblique drawing showing an example of a case where the RF coil device and the coil side radio communication device are integrally composed, as the first modified embodiment.

FIG. 6 is a schematic oblique drawing showing an example of a case where the above RF coil device 100 and the coil side radio communication device 200 are integrally composed, i.e. a case where the coil side radio communication device 200 is a part of the RF coil device 100, as the first modified embodiment.

The configuration of the RF coil device 100' in FIG. 6 is the same as the RF coil device 100 in FIG. 2 except that a blade member 105 incorporating the coil side radio communication device 200 is integrally formed on the edge side of the cover member 104' instead of the cable 102.

Inside the cover member 104' of the RF coil device 100', a control circuit (not shown) and a memory element (not shown) storing identification information of the RF coil device 100', and a plurality of the coil elements 106 are disposed in the way similar to the RF coil device 100. Note that, the memory element storing the above identification information may be arranged inside the coil side radio communication device 200.

Although the blade member 105 is folded into L-letter shape in FIG. 6, it can be folded into other shapes. The blade member 105 is made of a flexible material such as the aforementioned FPC and is capable of deformation such as folding in the way similar to the cover member 104'.

Although it is not shown in FIG. 6 to avoid complication, the fixing member 204 (see aforementioned FIG. 3) of the coil side radio communication device 200 is exposed on the rear surface side of the blade member 105. By this fixing member 204, the coil side radio communication device 200 in the blade member 105 is detachably and closely fixed to the control side radio communication device 300 in the aforementioned manner, and thereby radio communication is enabled. In such configuration of the RF coil device 100', its structure can be simplified in terms of omitting the cable 102 connected to the coil side radiocommunication device 200.

Note that, the coil side radio communication device 200 may be completely buried inside the blade member 105 without exposing a part of the coil side radio communication device 200, by disposing another fixing component for fixing it to the control side radio communication device 300 on the blade member 105.

In this case, it is preferable to narrow down the interval between the exposed surface on the fixing component side of the blade member 105 and antennas inside the coil side radio communication device 200 to such a degree that the radio communication via an induced electric field between the control side radio communication device 300 and the coil side radio communication device 200 is enabled.

[2] Arrangement of the control side radio communication devices 300 will be explained as the second modified embodiment using FIG. 7 and FIG. 8.

Figure 7:
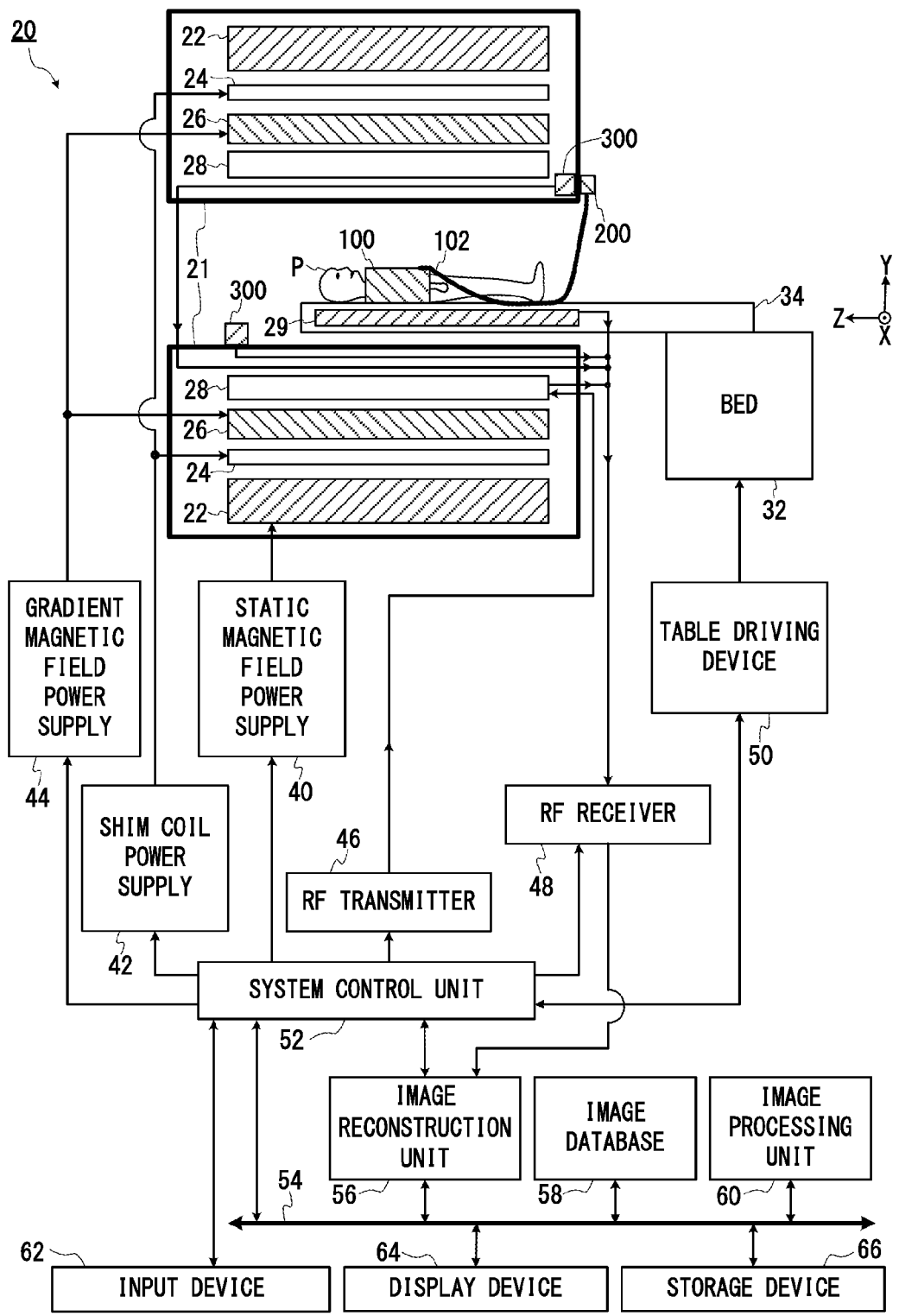
FIG. 7 is a block diagram showing an example of a case where the control side radio communication devices are arranged on the inner side and the entrance side of the gantry, as the second modified embodiment.

FIG. 7 is a block diagram showing an example of a case where the control side radio communication devices 300 are arranged on the inner side and the entrance side of the gantry 21.

Arrangement of the control side radio communication devices 300 is not limited to an aspect in which they are disposed on the table 34 like in FIG. 2. For example, the control side radio communication devices 300 may be disposed on arbitrary positions on the gantry 21 like in FIG. 7. Thus, the control side radio communication devices 300 may be disposed on the interior wall forming the air pocket of the gantry 21, or may be embedded in the interior wall, for example.

Figure 8:
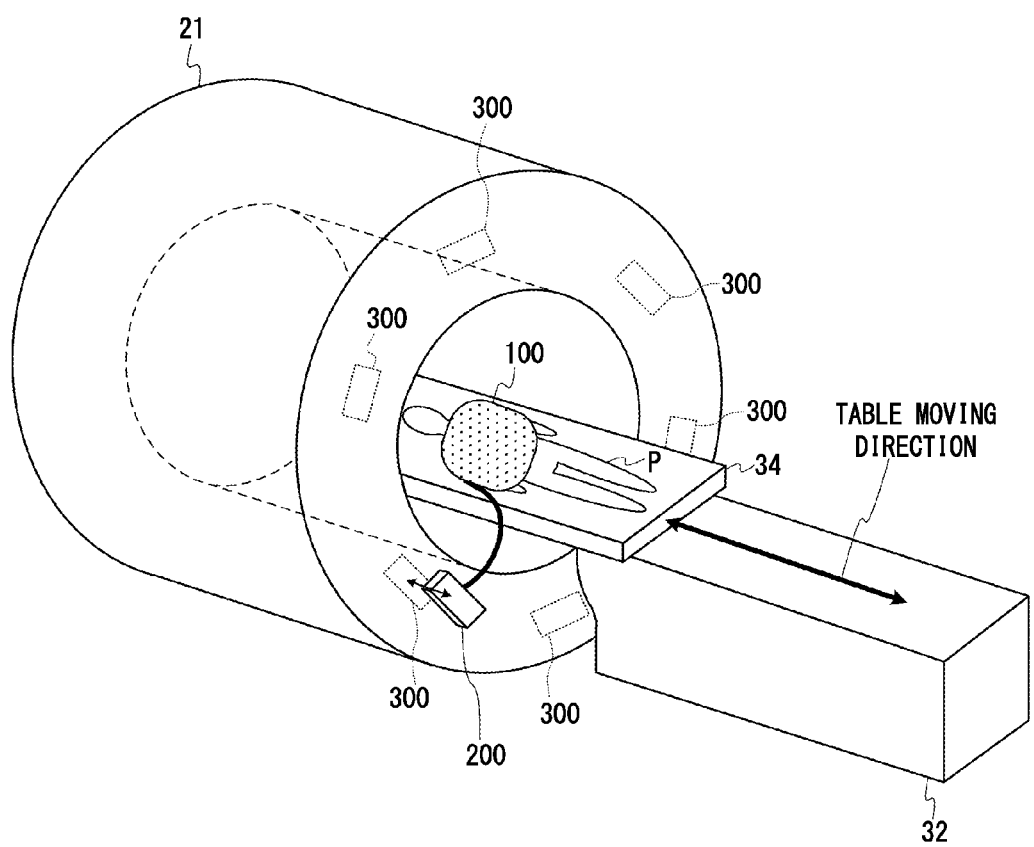
FIG. 8 is a schematic oblique drawing showing an example of arrangement of a plurality of the control side radio communication devices on the entrance side of the gantry.

FIG. 8 is a schematic oblique drawing showing an example of arrangement of a plurality of the control side radio communication devices 300 on the entrance side of the gantry 21 in FIG. 7. As shown in FIG. 8, the control side radio communication devices 300 are discretely (separately) disposed on the surface of the entrance side of the gantry 21 in a circular pattern. As an example here, each of the control side radio communication devices 300 are embedded in the entrance of the gantry 21 in such a manner that its surface of the fixing member 304 accords with the surface of the entrance of the gantry 21.

Note that, each of the control side radio communication devices 300 may be completely buried inside the entrance side of the gantry 21 without partially exposing itself, by disposing another fixing component for fixing the coil side radio communication device 200 on the gantry 21. In this case, it is preferable to narrow down the interval between the surface of the entrance of the gantry 21 and antennas inside the control side radio communication device 300 to such a degree that the radio communication via an induced electric field between the control side radio communication device 300 and the coil side radio communication device 200 is enabled.

Alternatively, the control side radio communication device 300 may be entirely exposed, instead of exposing the fixing member 304 only. That is, the surface of the control side radio communication device 300 opposite to the fixing member 304 may be fixed to the gantry 21.

As described above, no matter which part of the object P the RF coil device 100 is set on, the coil side radiocommunication device 200 can be closely fixed to one of the control side radio communication devices 300 by disposing many of the control side radio communication devices 300 on the entrance side or the inner side of the gantry 21. Thereby, handling flexibility is improved.

Additionally, if the control side radio communication devices 300 are disposed on the gantry 21 in the above manner, the signal path from the control side radio communication device 300 to the RF receiver 48 does not go through a movable portion (between the bed 32 and the table 34). In this case, the cables and the folding mechanism used in conventional technology can be omitted between the main unit side of the MRI apparatus 20 (the RF receiver 48 side) and the RF coil device 100.

More specifically, in conventional technology, there are cables connecting an RF coil device set on an object on a table with a connector arranged on a predetermined position of the bed (table) between the bed and the table. Thus, when the table slides into the inner side of the gantry, the cables are stretched. When the table slides out of the gantry onto the bed, the cables are folded.

If the control side radio communication devices 300 are disposed on the gantry 21 like in FIG. 7 or FIG. 8, the structure of the MRI apparatus can be simplified in terms of omitting the above cables and the folding mechanism. As a result, cost of manufacturing the MRI apparatus 20 can be reduced.

[3] Another example of fixing methods of the control side radio communication device and the coil side radio communication device will be explained as the third modified embodiment.

Figure 9:
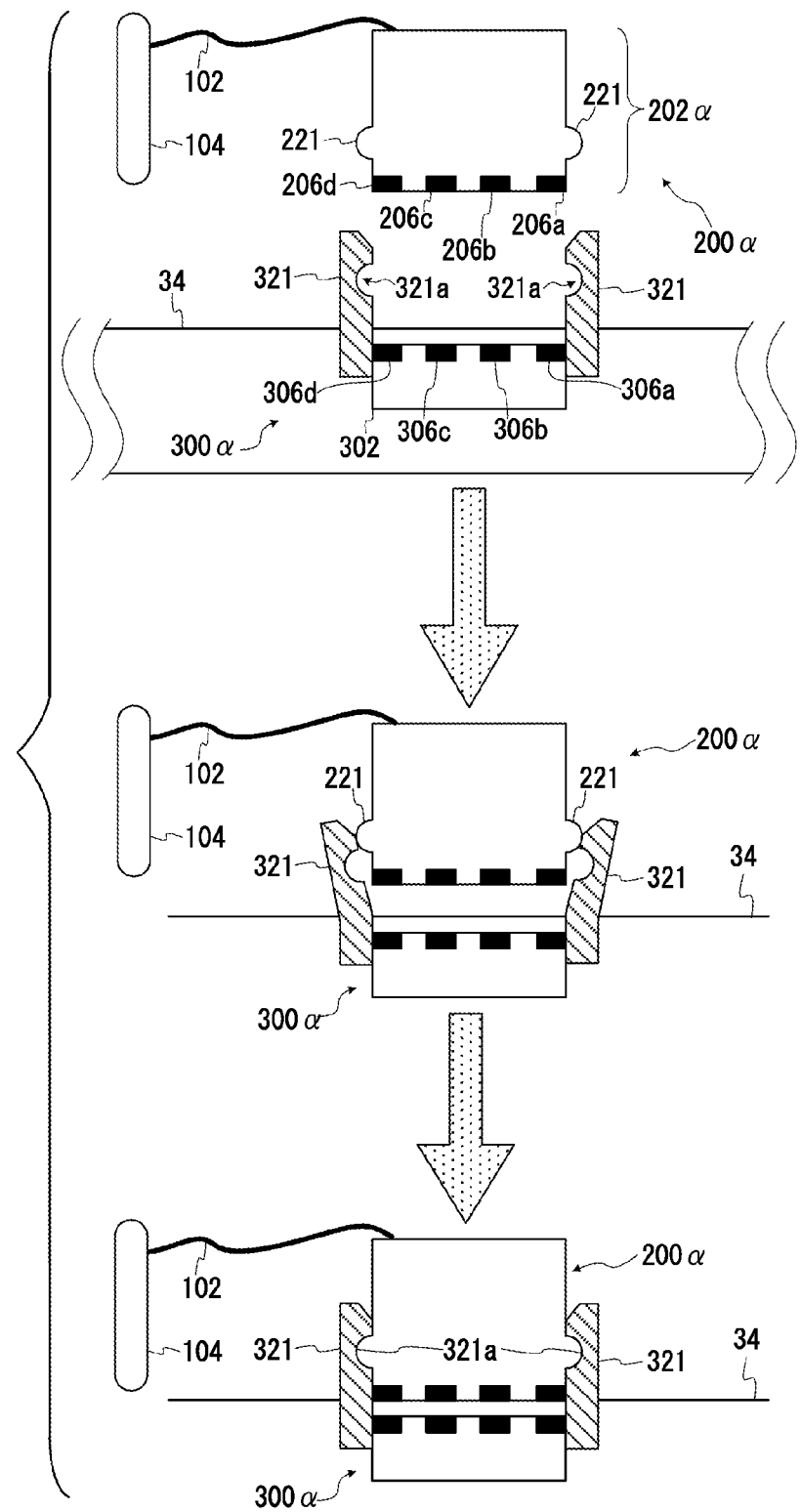
FIG. 9 is a schematic cross-sectional diagram showing another example of fixing methods of the coil side radio communication device and the control side radio communication device, as the third modified embodiment.

FIG. 9 is a schematic cross-sectional diagram showing another example of fixing methods of the coil side radio communication device and the control side radio communication device, as the third modified embodiment.

In the aforementioned embodiment, the coil side radio communication device 200 and the control side radio communication device 300 respectively includes the fixing members 204 and 304 of the hook-and-loop fasteners, for example (see FIG. 3).

On the other hand, in the example of FIG. 9, the coil side radio communication device 200α is fixed by being detachably inserted into the control side radio communication device 300α. That is, in the following example, the control side radio communication device 300α includes fixing plates 321 as a fixing unit, and the coil side radio communication device 200α includes bumps 221 as a fixing unit.

Hereinafter the above third modified embodiment will be explained in detail.

As shown in the upper part of FIG. 9, the coil side radio communication device 200α is the same structure as the coil side radio communication device 200 in FIG. 3 except that two bumps 221 as an example are formed on its chassis 202α instead of the fixing member 204.

In order to smoothen insertion and detachment of the coil side radio communication device 200α, each bump 221 is shaped in such a manner that its transverse section becomes a semicircle. This is because smoothly chamfered surfaces of the bumps 221 make it easier to insert the coil side radio communication device 200α than bumpy surfaces thereof, in general. The bumps 221 may be spherical, for example. Alternatively, the bumps 221 may be in the form of a bisected cylinder divided along its axis direction.

As an example here, the chassis 202a which includes the bump 221 is assumed to be made of undeformable nonmagnetic material. By forming it with nonmagnetic material, influence on the radio communication via an induced electric field can be avoided.

The control side radiocommunication device 300α has the same configuration as the control side radio communication device 300 in FIG. 3, except that, for example, two fixing plates 321 are included instead of the fixing member 304. Both of the fixing plates 321 are respectively fixed to ambilateral side surfaces of the chassis 302 of the control side radio communication device 300α by, for example, adhesive bonding.

Both fixing plates 321 are approximately in the form of a flat plate, for example, and disposed so as to face each other. As shown in the lower part of FIG. 9, each of the fixing plates 321 is shaped in the form of interdigitating the coil side radio communication device 200a. That is, dent parts 321a in the form of interdigitating the bump 221 are respectively chamfered on the mutually facing surfaces of the two fixing plates 321 at a position corresponding to each of the bumps 221 (see the upper part of FIG. 9).

Additionally, the end side (the side opposite to the chassis 302) of each of the fixing plates 321 is chamfered aslant in order to ease insertion of the coil side radio communication device 200α. As to the fixing plates 321, it is preferable to form them with elastic material of nonmagnetic body which can be curved to a degree shown in the middle part of FIG. 9. As such material, for example, plastic and synthetic resin can be used. The reason for forming them with nonmagnetic material is the same as before.

The control side radio communication device 300a is embedded behind the loading surface of the table 34 for the depth of interval D (the interval capable of the radio communication via an induced electric field) similar to FIG. 3, for example. On the loading surface of the table 34, ditches into which the fixing plates 321 can be inserted are formed, and the fixing plates 321 stick out of the loading surface of the table 34 via these ditches.

In the above structure, the coil side radio communication device 200α is inserted into the side of the control side radio communication device 300α from the state of the upper part of FIG. 9. At this insertion timing, as shown in the middle part of FIG. 9, each of the fixing plates 321 is bent in the direction of mutually separating. This is because the maximum width between both bumps 221 on the ambilateral side surface of the coil side radio communication device 200α is larger than the minimum width between both fixing plates 321.

Then, at the position where the basal plane of chassis 202α of the coil side radio communication device has contact with the loading surface of the table 34, both bumps 221 are respectively interdigitated with the dent parts 321a, and each of the fixing plates 321 returns to the original shape (shown in the upper part of FIG. 9 before insertion) by shape recovery force. Thereby, the coil side radio communication device 200α is detachably fixed to the control side radio communication device 300α on the table 34.

In the state in which the coil side radio communication device 200α and the control side radio communication device 300α are closely fixed to each other as just described, the antennas 206a to 206d are respectively disposed at positions where they face the antennas 306a to 306d respectively.

When imaging completes, the coil side radio communication device 200α is detached out of the fixing plates 321 so as to separate from the table 34.

[4] In the above embodiment, an example in which the A/D converters 212, the P/S converter 214 and the rechargeable battery BA are disposed inside the coil side radio communication device 200 has been explained (see FIG. 4). However, the embodiments of the present invention are not limited to such an aspect.

For example, the rechargeable battery BA may be disposed inside the cover member 104 of the RF coil device 100. Alternatively, the A/D converters 212 may be disposed inside the cover member 104 of the RF coil device 100. Alternatively the A/D converter 212 and the P/S converter 214 may be disposed inside the cover member 104 of the RF coil device 100.

Figure 10:
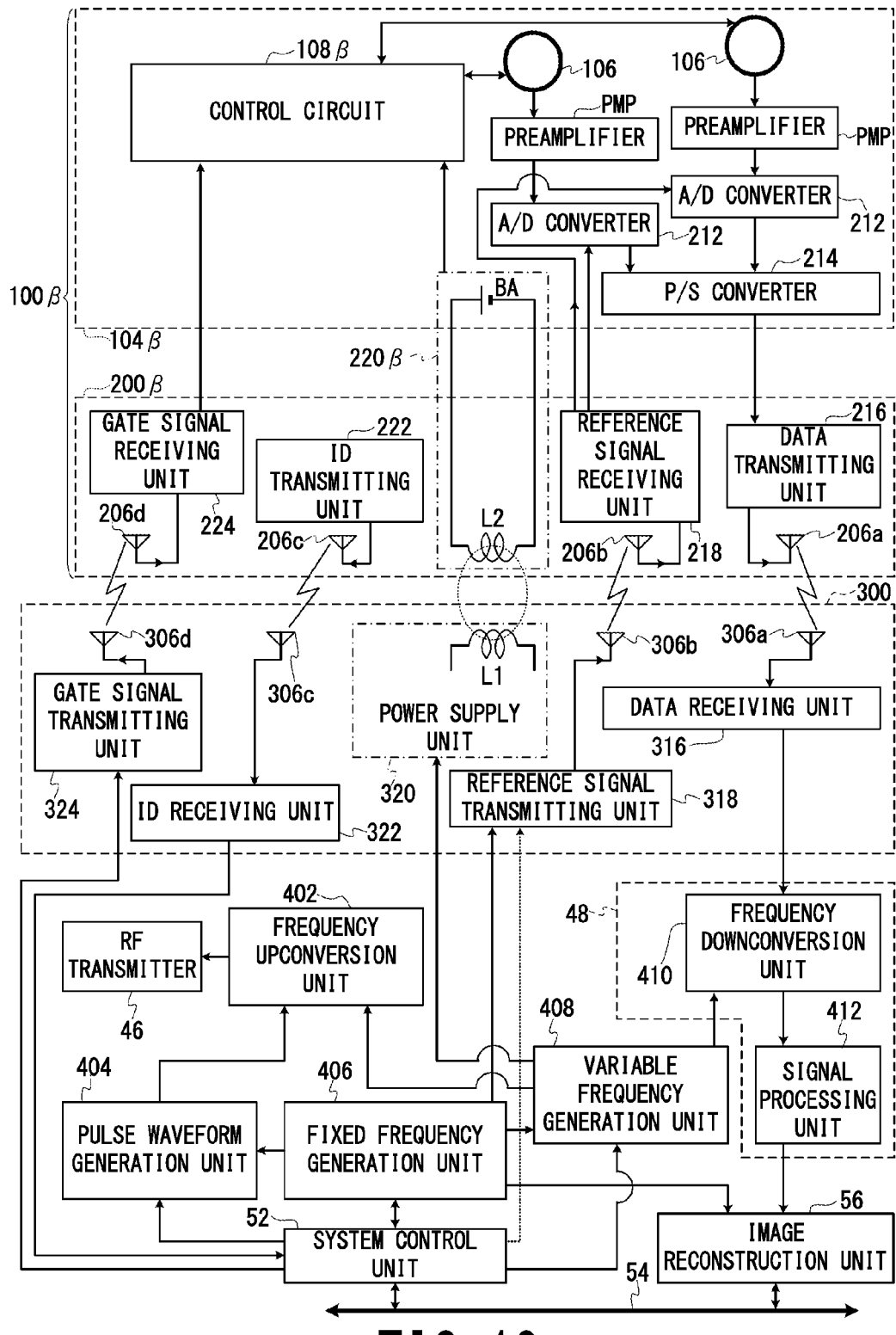
FIG. 10 is a block diagram showing another example of the arrangement of respective components on the side of the coil side radio communication device and the side of coil elements for detecting MR signals, as the fourth modified embodiment.

FIG. 10 is a block diagram showing another example of arrangement of respective components on the side of the coil side radio communication device 200β and the side of the coil elements for detecting MR signals, as the fourth modified embodiment.

In the example of FIG. 10, the coil side radio communication device 200β includes the data transmitting unit 216, the reference signal receiving unit 218, the coil L2, the ID transmitting unit 222, the gate signal receiving unit 224 and the antennas 206a to 206d.

On the other hand, inside a cover member 104β of an RF coil device 100β, a control circuit 108β, a plurality of the coil elements 106, a plurality of the preamplifiers PMP and the A/D converters 212 respectively corresponding to the coil elements 106, the P/S converter 214 and the rechargeable battery BA are disposed.

The difference between the configuration shown in FIG. 10 and the RF coil device 100 and the coil side radio communication device 200 explained in FIG. 2 and FIG. 3 is as follows.

Specifically, in the configuration shown in FIG. 10, processes up to conversion of a plurality of the MR signals respectively detected by the coil elements 106 into a serial signal are performed by the preamplifiers PMP, the A/D converters 212 and the P/S converter 214 inside the cover member 104β.

This serial signal is inputted from the P/S converter 214 in the cover member 104β to the data transmitting unit 216 of the coil side radio communication device 200β via the cable. Although the cable here corresponds to the cable 102 in FIG. 3 and connects the cover member 104β to the coil side radio communication device 200β, it is omitted in FIG. 10 in order to avoid complication.

Inside this cable, at least a signal wiring between the P/S converter 214 and the data transmitting unit 216, a supply wiring for charging current from the coil L2 to the rechargeable battery BA and a signal wiring between the gate signal receiving unit 224 and the control circuit 108β are included.

Additionally, in the configuration shown in FIG. 10, the structure corresponds to the power receiving unit 220 shown in FIG. 4 is separately arranged as the coil L2 inside the coil side radio communication device 200β and the rechargeable battery BA inside the cover member 104β (as the power receiving unit 220β in FIG. 10). Thus, the induced electric current in the coil L2 of the coil side radio communication device 200β caused by the excitation current flowing the coil L1 of the control side radio communication device 300 charges the rechargeable battery BA inside the cover member 104β as charging current via wiring inside the cable (not shown).

The other configuration of the cover member 104β is the same as the cover member 104 explained with FIG. 2. The other configuration of the coil side radio communication device 200β is the same as the embodiment explained with FIG. 1 to FIG. 5.

As to fixing means between the coil side radio communication device 200β and the control side radio communication device 300, the locking mechanism explained with FIG. 9 may be used, or the locking mechanism explained with FIG. 3 may be used, for example. Flow of signal processing at the time of performance of MRI is the same as the flow explained with FIG. 4 and FIG. 5.

Additionally, as an example in FIG. 10, "the coil side radio communication device 200β", "the cover member 104β" and "the cable which connects them each other and is not shown" are integrally represented as "the RF coil device 100β". As described earlier, this is only an example of interpretation. The coil side radio communication device 200β may be interpreted as not apart of the RF coil device 100β but a structure independent of the RF coil device 100β.

In the structure in which the A/D converters 212, the P/S converter 214 and the rechargeable battery BA are disposed to the side of the cover member 104 of the RF coil device 100 as shown in FIG. 10, the coil side radio communication device 200β can be lightened in terms of weight. In this case, it becomes easier to treat the coil side radio communication device 200β at the time of, for example, fixing it to the control side radio communication device 300.

Note that FIG. 10 is only an example of the embodiments. Therefore, the rechargeable battery BA, the A/D converters 212 and the P/S converter 214 may be included in the coil side radiocommunication device (200) like in FIG. 4.

[5] In the embodiment shown in FIG. 2, an example in which the position of the control side radio communication device 300 is dormant and the coil side radio communication device 200 has variability in position in relation to the position of the cover member 104 of the RF coil device 100 by the cable 102 has been explained. However, embodiments of the present invention are not limited to such an aspect.

Figure 11:
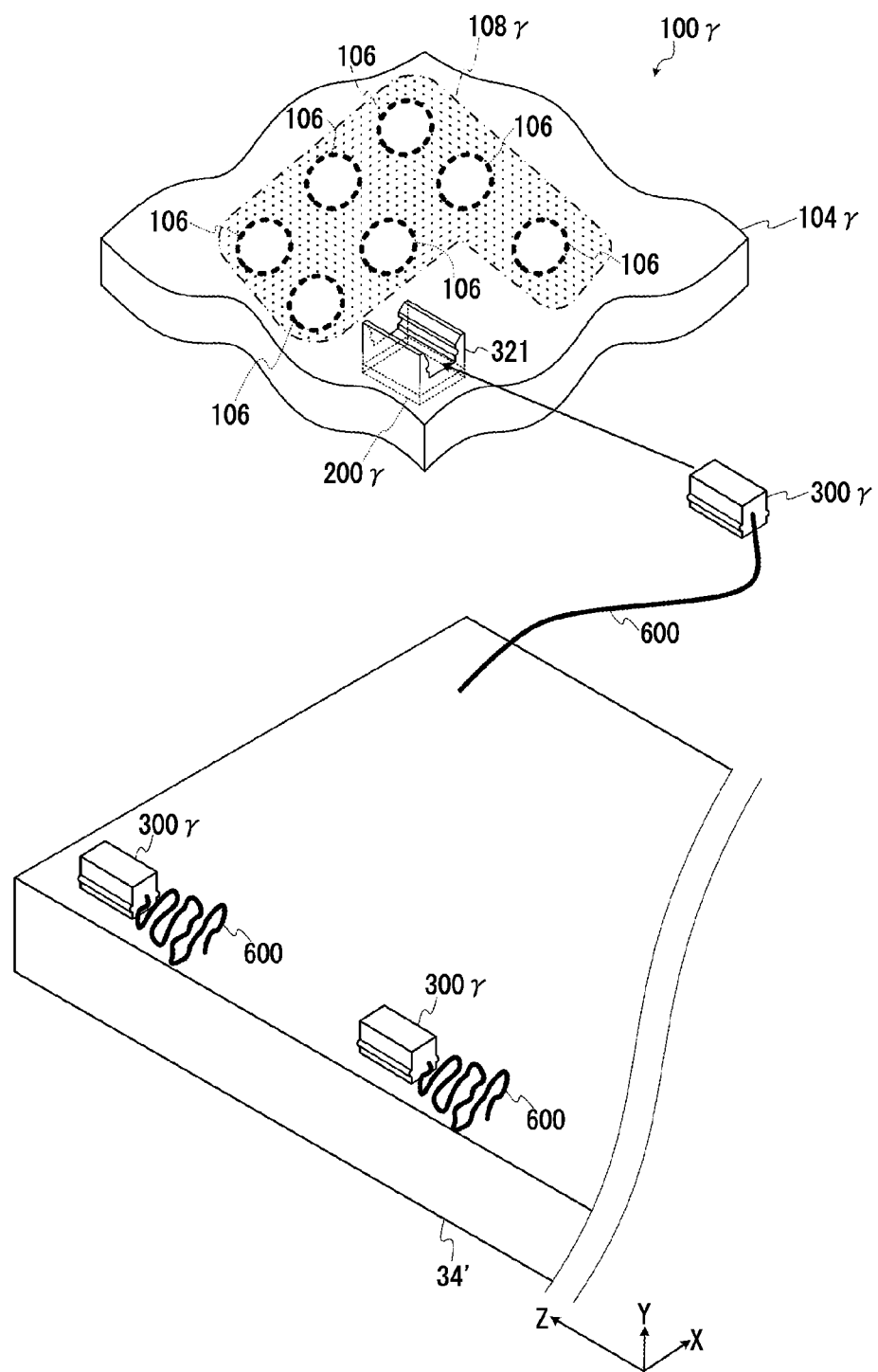
FIG. 11 is a schematic oblique drawing of the table and the RF coil device for the fifth modified embodiment.

As the fifth modified embodiment, as shown in FIG. 11, the coil side radio communication device 200γ may be fixed to the cover member 104 of the RF coil device 100γ and the position of the control side radio communication device 300γ may be variable.

FIG. 11 is a schematic oblique drawing of the table 34' and the RF coil device 100γ for the fifth modified embodiment. In FIG. 11, the RF coil device 100γ has the same structure as the RF coil device 100 explained with FIG. 2 except the following two points.

Firstly, the coil side radio communication device 200γ is embedded inside the cover member 104γ of the RF coil device 100γ.

Secondly, the fixing plates 321 which detachably fix the control side radio communication device 300γ are fixed to the cover member 104γ (as parts of the coil side radio communication device 200γ) instead of omitting the cable 102 on the RF coil device side. Note that the structures of the coil elements 106 and the control circuit 108γ are the same as the RF coil device 100.

In addition, the cables 600 are exposed from the respective positions corresponding to installation positions of the respective control side radio communication devices 300γ in FIG. 2 on the table 34', and each of the control side radio communication devices 300γ is connected to the terminal of each of the cables 600.

In this structure, the RF coil device 100γ is set on the object P, the control side radio communication device 300γ whose position is the nearest to the setting position is placed on the cover member 104γ of the RF coil device 100γ by the cables 600 and is fixed by the fixing plates 321, for example.

Thus, each length of each cable 600 can be, for example, equal to or longer than 30 cm, in order to facilitate moving each control side radio communication device 300γ closer to the RF coil device 100γ.

In FIG. 11, the coil elements 106 are respectively disposed to places which are sufficiently separated from the installation position of the coil side radio communication device 200γ, in order to avoid interference between the coil side radio communication device 200γ and the coil elements 106. However, this is only an example of arrangement, and embodiments of the present invention are not limited to such an aspect.

The interference between the coil side radio communication device 200γ and its circumjacent coil elements 106 can be lessened (suppressed) by forming the coil side radio communication device 200γ into a long and thin shape, for example. If the interference between both sides is small enough by adopting the above configuration or another appropriate method, the coil element 106 can be disposed downward and the coil side radio communication device 200γ can be disposed on the upper side of this coil element 106 in the thickness direction of the cover member 104γ. Similarly, the coil side radio communication device 200γ can be disposed between one and another of the coil elements.

Figure 12:
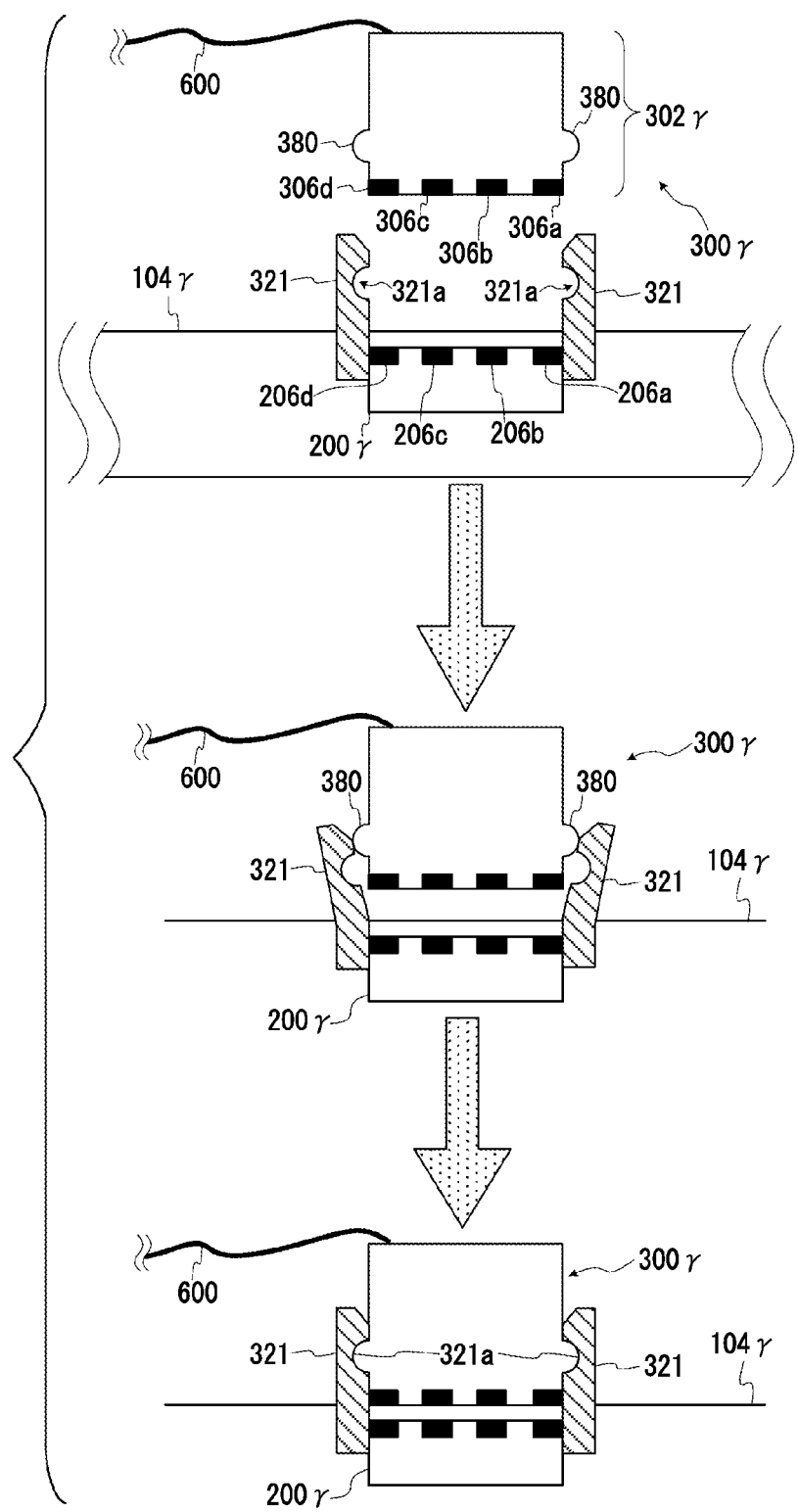
FIG. 12 is a schematic cross-sectional diagram showing an example of fixing methods of the coil side radio communication device and the control side radio communication device in FIG. 11 of the fifth modified embodiment.

FIG. 12 is a schematic cross-sectional diagram showing an example of fixing methods of the coil side radio communication device 200γ and the control side radio communication device 300γ in FIG. 11 of the fifth modified embodiment.

The structures of the two fixing plates 321 are the same as the fixing plates 321 in FIG. 9, and the difference is their arrangement only. That is, one end of each of the two fixing plates 321 is embedded in the cover member 104γ of the RF coil device 100γ, and thereby the two fixing plates 321 are fixed.

As shown in the upper part of FIG. 12, the control side radio communication device 300γ has the same structure as the control side radio communication device 300 in FIG. 3, except that the bumps 380 are formed on its chassis 302γ.

The size and shape of each of the bumps 380 are the same as the bumps 221 in FIG. 9, and the bumps 380 are made of undeformable nonmagnetic material.

As shown in the lower part of FIG. 12, the two fixing plates 321 are disposed so as to interdigitate the control side radio communication device 300γ. That is, the dent parts 321a in the form of interdigitating the bump 380 are respectively chamfered on the mutually facing surfaces of the two fixing plates 321 at a position corresponding to each of the bumps 380 (see the upper part of FIG. 12).

In the above structure, the control side radio communication device 300γ is inserted into the space between both of the fixing plates 321. At this insertion timing, as shown in the middle part of FIG. 12, each of the fixing plates 321 is bent in the direction of mutually separating (the same as the case in FIG. 9).

Then, both bumps 380 of the control side radio communication device 300γ are respectively interdigitated with the dent parts 321a, and each of the fixing plates 321 returns to the original shape (shown in the upper part of FIG. 12) by shape recovery force. Thereby, the control side radio communication device 300γ is detachably fixed to the coil side radio communication device 200γ on the cover member 104γ.

In the state in which the coil side radio communication device 200γ and the control side radio communication device 300γ are closely fixed to each other as just described, the distance between the coil side radio communication device 200γ and the control side radio communication device 300γ becomes the aforementioned interval D which enables radio communication via an induced electric field. Additionally, in this state, the antennas 206a to 206d are respectively disposed at positions where they face the antennas 306a to 306d respectively.

[6] As a supplementary note of the above fifth modified embodiment, the following structure can be alternatively used. That is, the cable 102 is disposed between the RF coil device 100 and the coil side radio communication device 200 like in FIG. 2, and the cables 600 are disposed between the table 34' and each of the control side radio communication devices 300 like in FIG. 11. In this structure, the coil side radio communication device 200 and the control side radio communication device 300 are mutually detachably fixed by fixing structure such as the aforementioned hook-and-loop fastener, for example.

[7] The RF coil devices 100, 100', 100β and 100γ (see FIG. 2, FIG. 6, FIG. 10 and FIG. 11) may block off (stop) electric power supply to the A/D converters 212 except scan periods such as a prescan and a main scan.

Specifically, for example, the control circuit of (108, 108β and 108γ) of the RF coil device (100, 100', 100β and 100γ) recognizes start timing of a scan when a special waveform is appeared in the continuously transmitted gate signal. The above special waveform means, for example, a waveform in which an on-level gate signal and an off-level gate signal are alternately repeated six or seven times at short time intervals.

Similarly, the control circuit of (108, 108β and 108γ) recognizes end timing of a scan when a special waveform is appeared in the continuously transmitted gate signal. Therefore, the RF coil device (100, 100', 100β and 100γ) judges a scan period based on the gate signal and makes the power receiving unit 220 supply electric power to the A/D converters 212 during each of the scan periods only.

The above scan periods mean the period of the prescan in the Step S3 and the period of the main scan in the Step S5 in the case of FIG. 5. In this structure, power consumption of the RF coil device (100, 100', 100β and 100γ) can be reduced.

[8] Correspondences between terms used in the claims and terms used in the embodiment described above will be described. Note that the correspondences described below are just some of possible interpretations for reference and should not be construed as limiting the present invention.

The coil side radio communication devices 200, 200α, 200β, and 200γ are examples of the first radio communication unit described in claims.

The control side radio communication devices 300, 300α and 300γ are examples of the second radio communication unit described in claims.

The A/D converters 212 are examples of the A/D conversion unit described in claims.

The cable 102 and the blade member 105 are examples of the signal transmission member described in the claims.

The coil elements 106 are examples of the detecting unit described in the claims.

The fixing plates 321 of the RF coil device 100γ in FIG. 11 and FIG. 12 are examples of the fixing structure described in the claims.

[9] While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus obtaining a nuclear magnetic resonance signal from an RF coil device which detects the nuclear magnetic resonance signal emitted from an object, the magnetic resonance imaging apparatus comprising:
    a first radio communication unit configured to obtain the nuclear magnetic resonance signal detected by the RF coil device, and wirelessly transmit the nuclear magnetic resonance signal in a digitized state via an induced electric field;
    a second radio communication unit configured to receive the nuclear magnetic resonance signal wirelessly transmitted from the first radio communication unit via the induced electric field; and
    an image reconstruction unit configured to reconstruct image data of the object based on the nuclear magnetic resonance signal received by the second radio communication unit,
    wherein the first radio communication unit is closely fixed to the second radio communication unit.

2. The magnetic resonance imaging apparatus according to claim 1, wherein said closely fixing includes configuring a fixing unit to fix the first radio communication unit and the second radio communication unit to each other, so as to make an interval between the first radio communication unit and the second radio communication unit in a fixed state capable of radio communication via the induced electric field.

3. The magnetic resonance imaging apparatus according to claim 2, comprising a plurality of second radio communication units that respectively receive the nuclear magnetic resonance signal wirelessly transmitted from the first radio communication unit via the induced electric field.

4. The magnetic resonance imaging apparatus according to claim 3,
    wherein the RF coil device is a part of the magnetic resonance imaging apparatus and includes a plurality of coil elements configured to respectively detect the nuclear magnetic resonance signal emitted from the object.

5. The magnetic resonance imaging apparatus according to claim 4, further comprising a power supply unit configured to wirelessly supply electric power to the RF coil device via an induced magnetic field.

6. The magnetic resonance imaging apparatus according to claim 5,
    wherein the RF coil device includes an A/D conversion unit configured to digitize a plurality of nuclear magnetic resonance signals respectively detected by the plurality of coil elements, and stops power supply to the A/D conversion unit during a period when a scan is not performed.

7. The magnetic resonance imaging apparatus according to claim 6,
wherein the RF coil device further includes a preamplifier configured to be inserted between the A/D conversion unit and the plurality of coil elements, amplify analogue nuclear magnetic resonance signals respectively outputted from the plurality of coil elements, and transmit amplified nuclear magnetic resonance signals to the A/D conversion unit side.

8. The magnetic resonance imaging apparatus according to claim 2,
wherein the second radio communication unit is disposed so as to be exposed on a table on which the object is loaded.

9. The magnetic resonance imaging apparatus according to claim 2,
wherein the second radio communication unit is embedded inside a table on which the object is loaded.

10. The magnetic resonance imaging apparatus according to claim 2,
wherein the second radio communication unit is disposed so as to be exposed on a gantry.

11. The magnetic resonance imaging apparatus according to claim 2,
wherein the second radio communication unit is embedded inside a gantry.

12. The magnetic resonance imaging apparatus according to claim 2,
wherein the RF coil device is a part of the magnetic resonance imaging apparatus and integrally constructed with the first radio communication unit.

13. The magnetic resonance imaging apparatus according to claim 12,
wherein the RF coil device includes a plurality of coil elements which respectively detect the nuclear magnetic resonance signal emitted from the object.

14. The magnetic resonance imaging apparatus according to claim 12,
wherein the RF coil device includes an A/D conversion unit configured to digitize a plurality of nuclear magnetic resonance signals respectively detected by the plurality of coil elements, and stops power supply to the A/D conversion unit during a period when a scan is not performed.

15. The magnetic resonance imaging apparatus according to claim 12,
wherein the RF coil device further includes a preamplifier configured to amplify the nuclear magnetic resonance signal before digitalization of the nuclear magnetic resonance signal.

16. The magnetic resonance imaging apparatus according to claim 2, further comprising a signal transmission member configured to connect the RF coil device to the first radio communication unit with a wire, and transmit the nuclear magnetic resonance signal from the RF coil device to the first radio communication unit.

17. The magnetic resonance imaging apparatus according to claim 2, further comprising a power supply unit configured to wirelessly supply electric power to the RF coil device via an induced magnetic field.

18. An RF coil device comprising:
a detecting unit configured to detect a nuclear magnetic resonance signal emitted from an object;
an A/D conversion unit configured to digitize the nuclear magnetic resonance signal: and
a first radio communication unit configured to wirelessly transmit the nuclear magnetic resonance signal digitized by the A/D conversion unit via an induced electric field to a second radio communication unit which is closely fixed to the first radio communication unit.

19. The RF coil device according to claim 18, further comprising a preamplifier configured to amplify the nuclear magnetic resonance signal outputted from the detecting unit and transmit an amplified nuclear magnetic resonance signal to the A/D conversion unit side.

20. The RF coil device according to claim 19,
wherein the first radio communication unit is configured to include a fixing structure; and
the fixing structure is configured to be detachably fixed to the second radio communication unit of a magnetic resonance imaging apparatus as a destination of the nuclear magnetic resonance signal, in such a manner that an interval between the first radio communication unit and the second radio communication unit becomes an interval capable of radio communication via the induced electric field.

\* \* \* \* \*

UNITED STATES PATENT AND TRADEMARK OFFICE
CERTIFICATE OF CORRECTION

PATENT NO. : 9,519,038 B2
APPLICATION NO. : 13/945370
DATED : December 13, 2016
INVENTOR(S) : Okamoto et al.

It is certified that error appears in the above-identified patent and that said Letters Patent is hereby corrected as shown below:

On the Title Page

Item [54] and in the Specification, Column 1, Lines 1-2 the title reads:

--MAGENTIC RESONANCE IMAGING APPARATUS AND RF COIL DEVICE--

The title should be:

--MAGNETIC RESONANCE IMAGING APPARATUS AND RF COIL DEVICE--

Signed and Sealed this
Fourth Day of April, 2017

Michelle K. Lee
*Director of the United States Patent and Trademark Office*